(12) United States Patent
Ohashi et al.

(10) Patent No.: US 12,501,677 B2
(45) Date of Patent: Dec. 16, 2025

(54) SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventors: Teruyuki Ohashi, Kawasaki Kanagawa (JP); Tatsuo Shimizu, Tokyo (JP); Hiroshi Kono, Himeji Hyogo (JP); Shunsuke Asaba, Himeji Hyogo (JP); Takahiro Ogata, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 409 days.

(21) Appl. No.: 18/177,329

(22) Filed: Mar. 2, 2023

(65) Prior Publication Data

US 2024/0072121 A1    Feb. 29, 2024

(30) Foreign Application Priority Data

Aug. 26, 2022   (JP) .................. 2022-135433

(51) Int. Cl.
*H10D 62/83*    (2025.01)
*H10D 8/60*    (2025.01)
(Continued)

(52) U.S. Cl.
CPC ........... *H10D 62/8325* (2025.01); *H10D 8/60* (2025.01); *H10D 84/146* (2025.01)

(58) Field of Classification Search
CPC . H01L 21/02378; H01L 21/0445–0495; H01L 21/02167; H01L 21/02447;
(Continued)

(56) References Cited

U.S. PATENT DOCUMENTS 7,855,384 B2    12/2010   Yamamoto et al.
8,680,538 B2    3/2014    Tarui et al.
(Continued)

FOREIGN PATENT DOCUMENTS

JP    2007281352 A    10/2007
JP    2018093177 A    6/2018
(Continued)

OTHER PUBLICATIONS

Not yet published, Japanese Patent Application No. 2021-190279, filed on Nov. 24, 2021.

(Continued)

*Primary Examiner* — Moin M Rahman
(74) *Attorney, Agent, or Firm* — Maier & Maier, PLLC

(57) ABSTRACT

A semiconductor device according to an embodiment includes a transistor region and a diode region. The transistor region includes n-type first SiC region having a first portion contacting a first plane, p-type second SiC region, n-type third SiC region, and a gate electrode. The diode region includes the first SiC region having a second portion contacting the first plane and p-type fourth SiC region. The semiconductor device includes a first electrode contacting the first portion and the second portion and a second electrode contacting a second plane. An occupied area per unit area of the fourth SiC region is larger than an occupied area per unit area of the second SiC region. In addition, a first diode region is provided between a first transistor region and a second transistor region. An inorganic insulating layer is provided between the first electrode and a gate wiring adjacent to the first electrode.

18 Claims, 33 Drawing Sheets

(51) Int. Cl.
*H10D 62/832* (2025.01)
*H10D 84/00* (2025.01)

(58) Field of Classification Search
CPC ......... H01L 21/02529; H01L 21/02068; H01L 21/32134; H01L 21/32136; H01L 21/32137; H01L 21/3213; H01L 21/0228; H01L 23/3171; H01L 23/4824; H10D 62/8325; H10D 84/014; H10D 84/0158; H10D 84/0177; H10D 84/038; H10D 84/83; H10D 84/834; H10D 84/85; H10D 84/853; H10D 86/215; H10D 30/6215; H10D 30/0217; H10D 30/024; H10D 84/146; H10D 8/422; H10D 62/157; H10D 8/051; H10D 8/50; H10D 62/8503; H10D 64/01; H10D 64/64; H10D 62/126; H10D 62/60; H10D 62/106; H10D 62/102; H10D 62/124; H10D 8/60–605; H10D 8/045; H10D 8/411; H10D 8/00–825; H10D 8/041; H10D 8/06; C01B 32/956–984; C23C 16/325

See application file for complete search history.

(56) References Cited

U.S. PATENT DOCUMENTS

| | | | |
|---|---|---|---|
| 9,786,778 B1 | 10/2017 | Morizuka | |
| 2015/0349051 A1* | 12/2015 | Uchida | H10D 84/01 257/77 |
| 2017/0236935 A1 | 8/2017 | Ebihara et al. | |
| 2018/0151719 A1 | 5/2018 | Sano et al. | |
| 2019/0081170 A1* | 3/2019 | Kumagai | H10D 84/038 |
| 2022/0013639 A1 | 1/2022 | Tanaka et al. | |
| 2023/0163166 A1 | 5/2023 | Ohashi et al. | |

FOREIGN PATENT DOCUMENTS

| | | |
|---|---|---|
| JP | 2020074426 A | 5/2020 |
| JP | 2022009745 A | 1/2022 |
| JP | 2022016286 A | 1/2022 |
| JP | 2023077119 A | 6/2023 |
| WO | 2009101668 A1 | 8/2009 |
| WO | 2009101688 A1 | 8/2009 |
| WO | 2016052261 A1 | 4/2016 |

OTHER PUBLICATIONS

U.S. Appl. No. 17/822,949, projected publication date on May 25, 2023.
Office Action issued on Oct. 21, 2025, in corresponding Japanese Application No. 2022-135433, 12 pages.

* cited by examiner

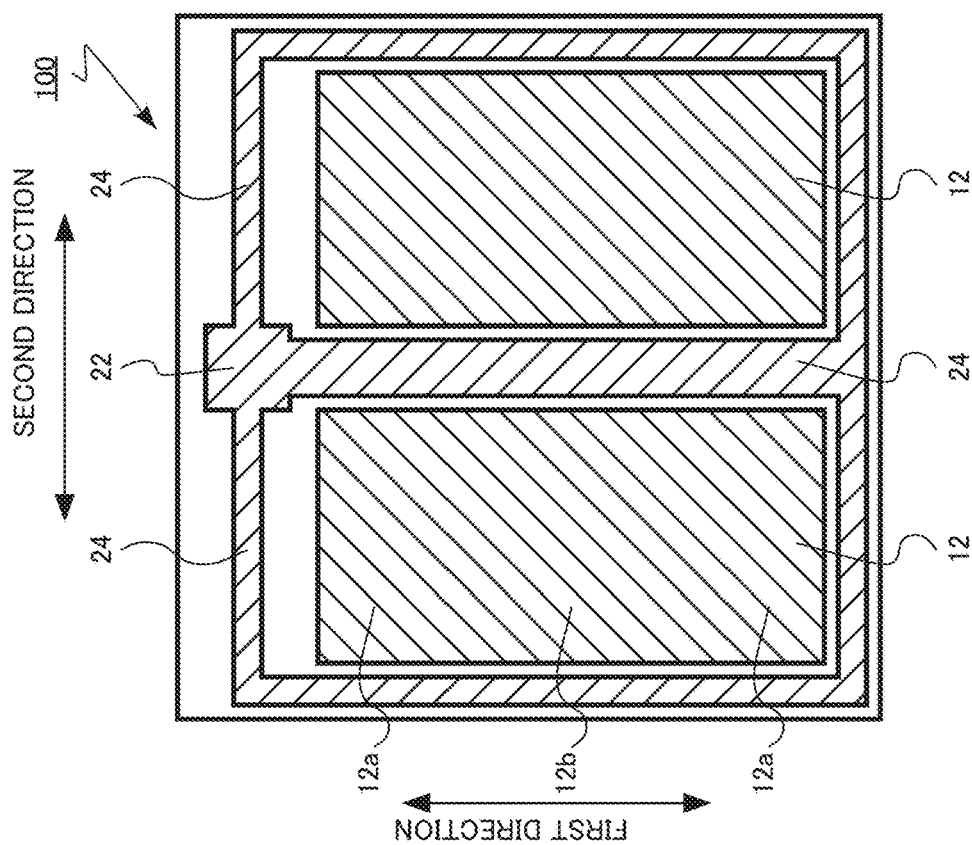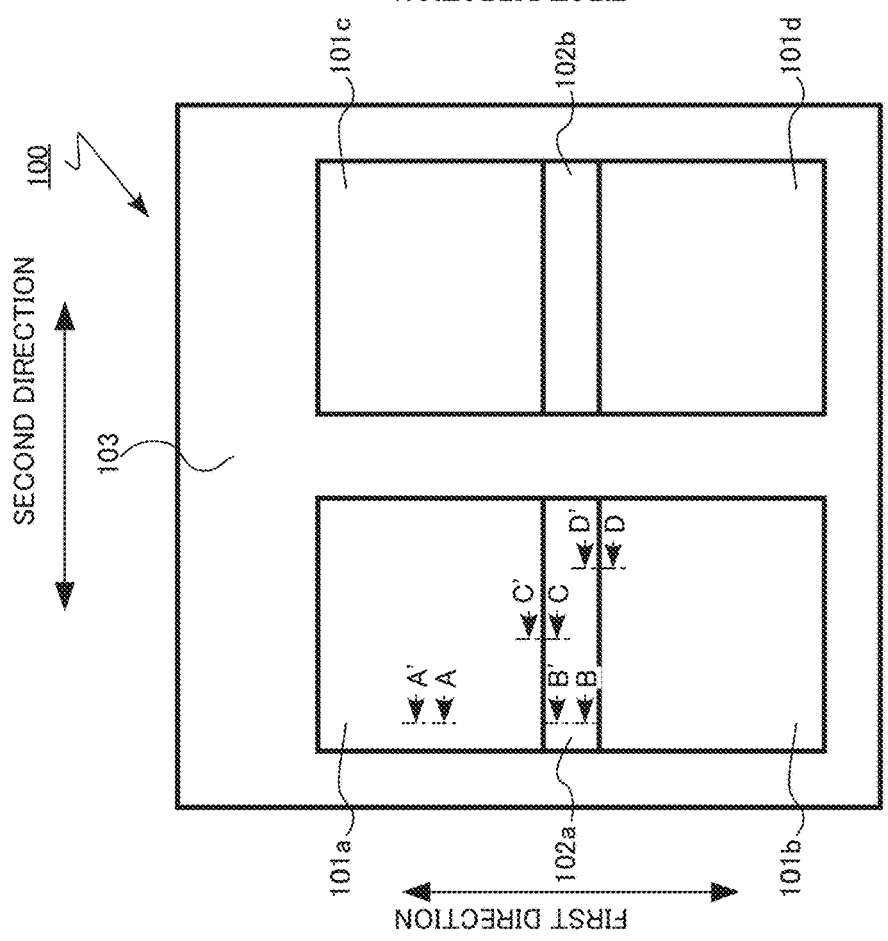

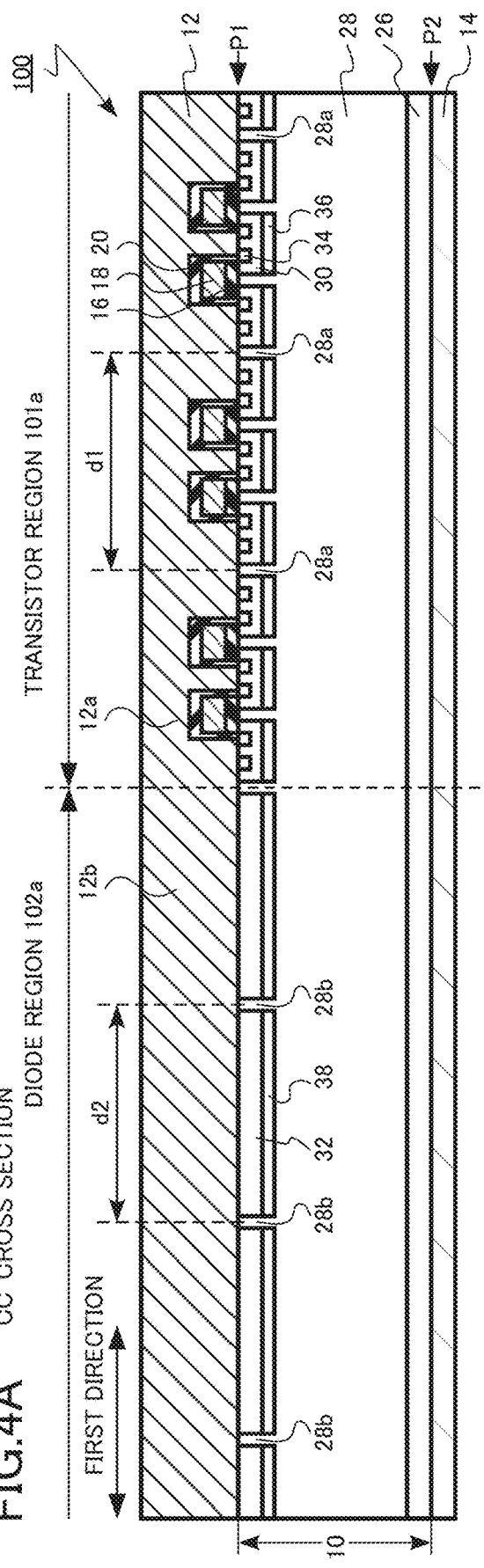
FIG. 4A CC' CROSS SECTION
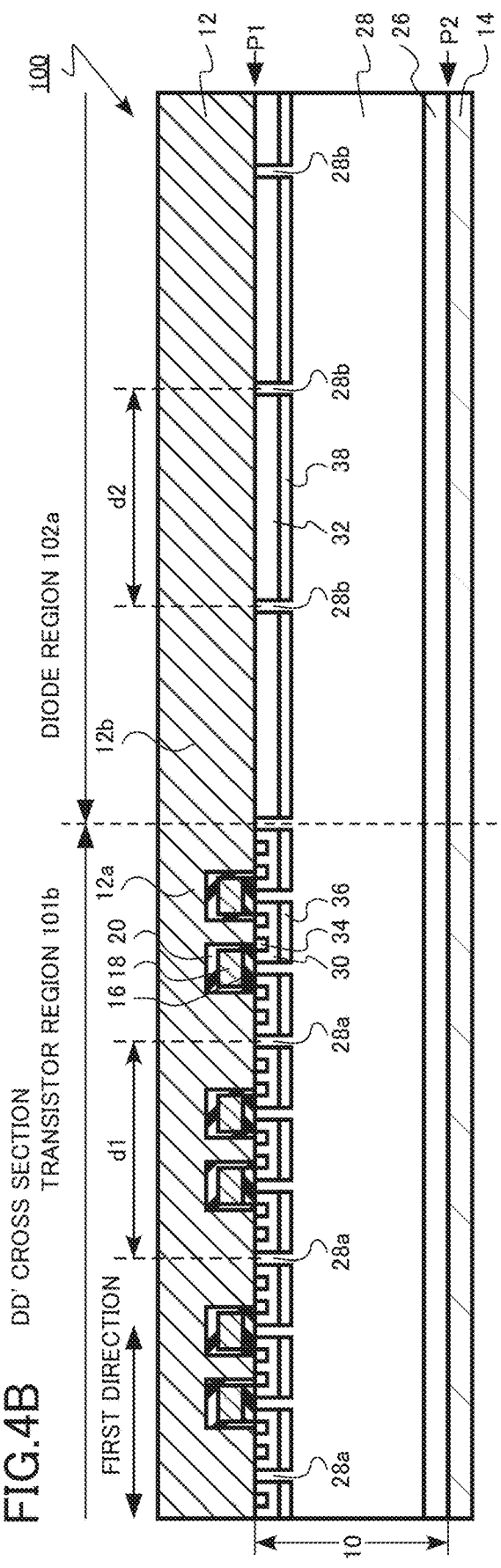
FIG. 4B DD' CROSS SECTION

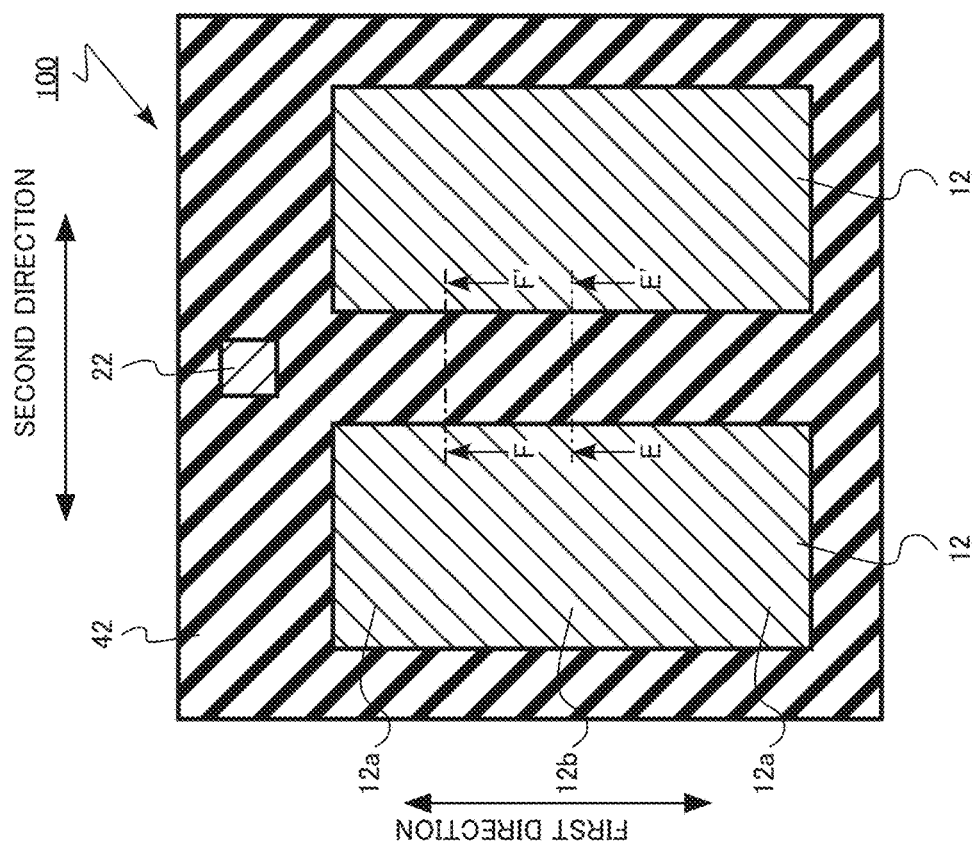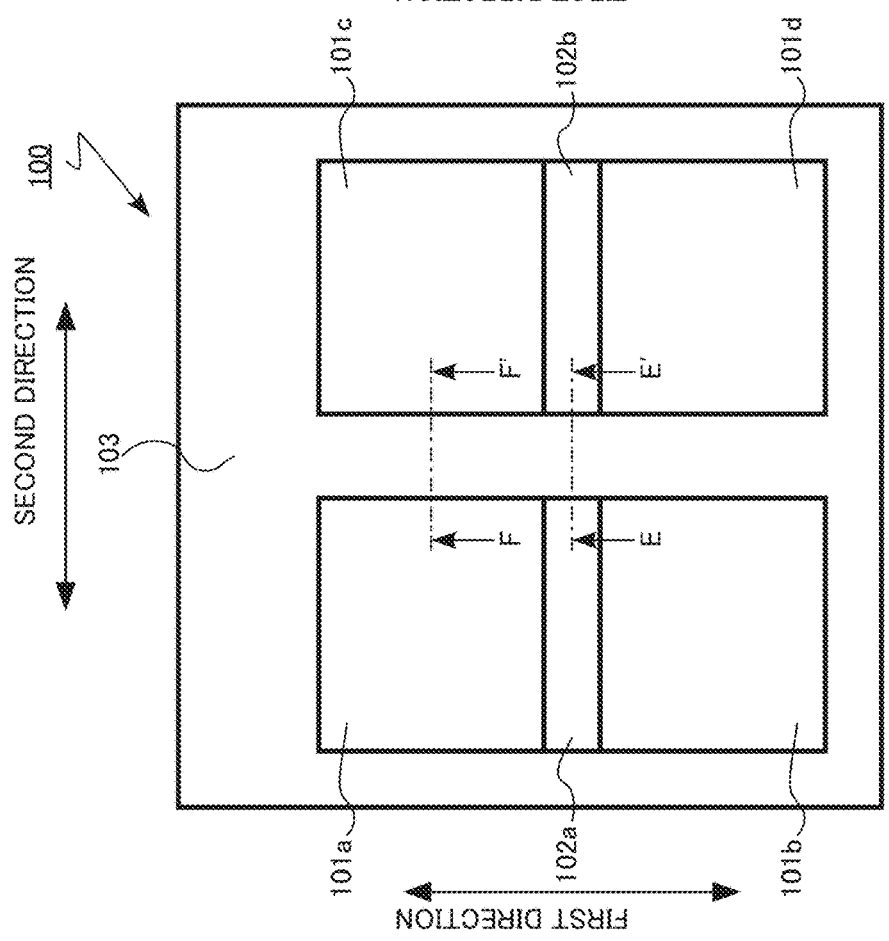

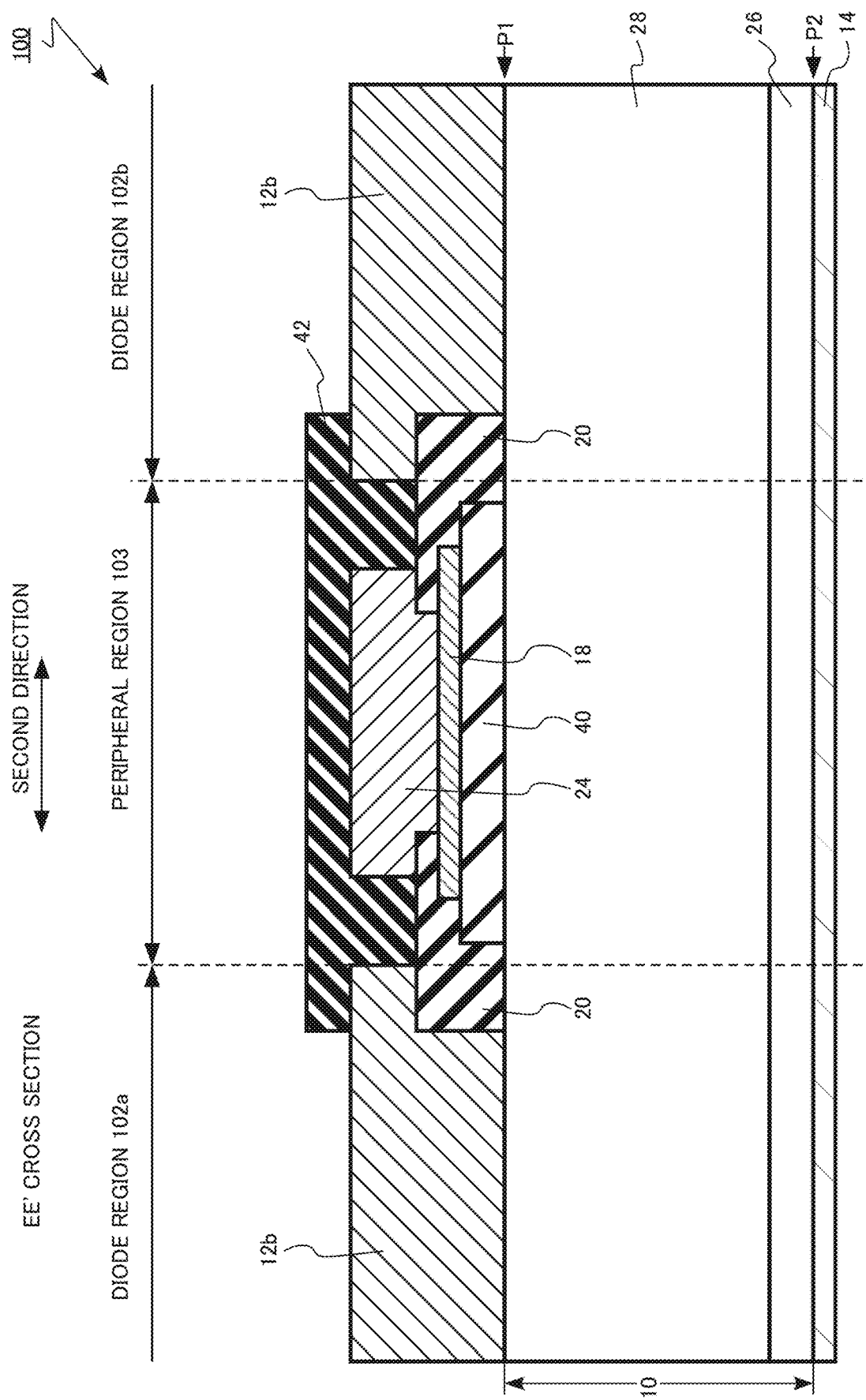
FIG.7 EE' CROSS SECTION

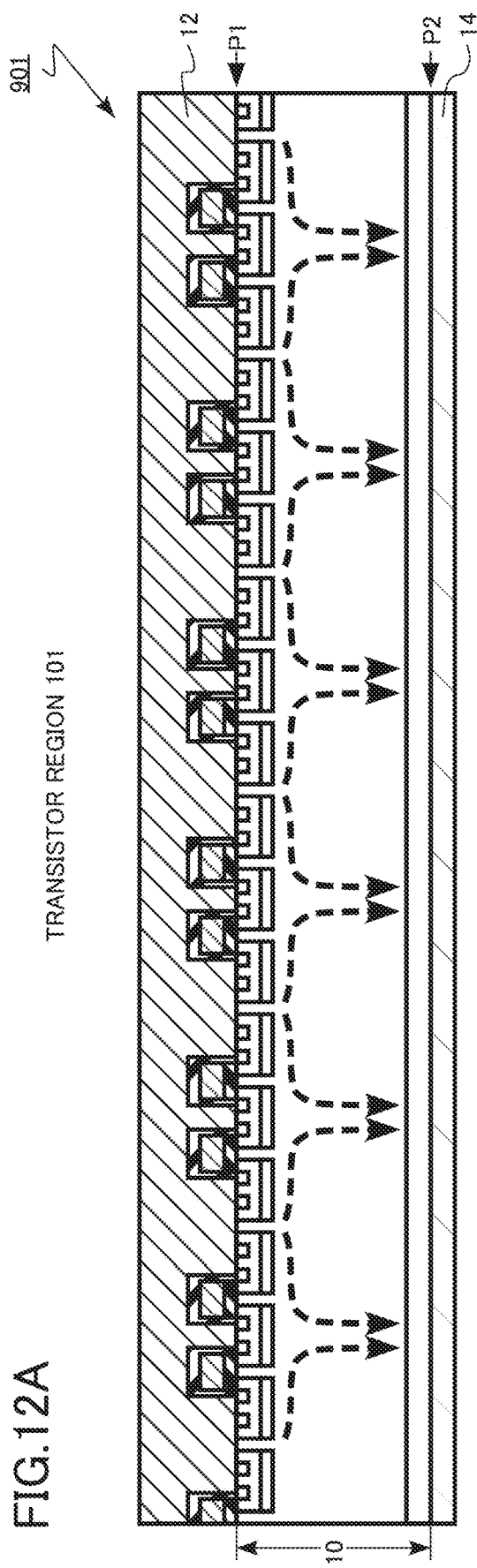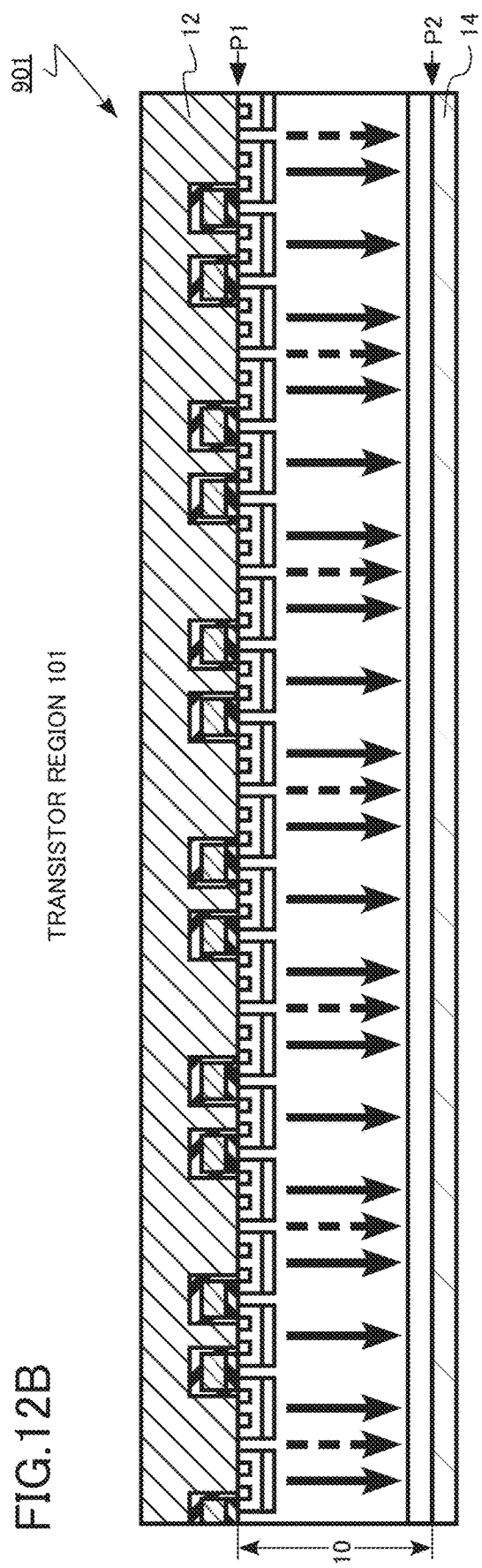

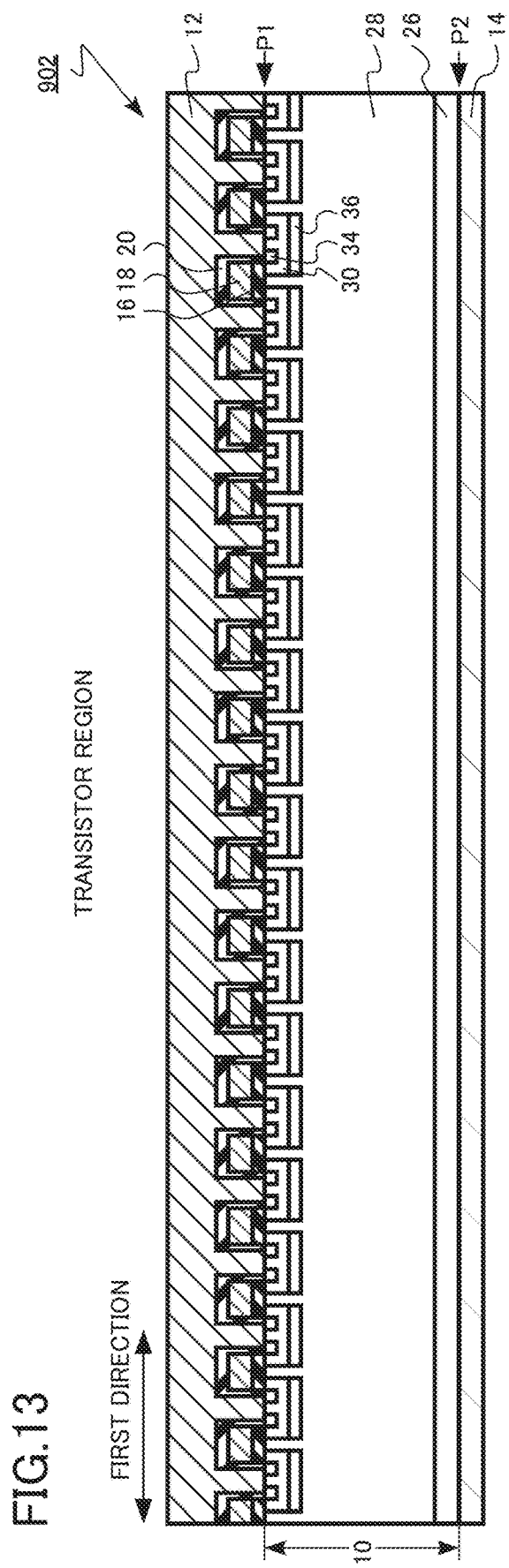

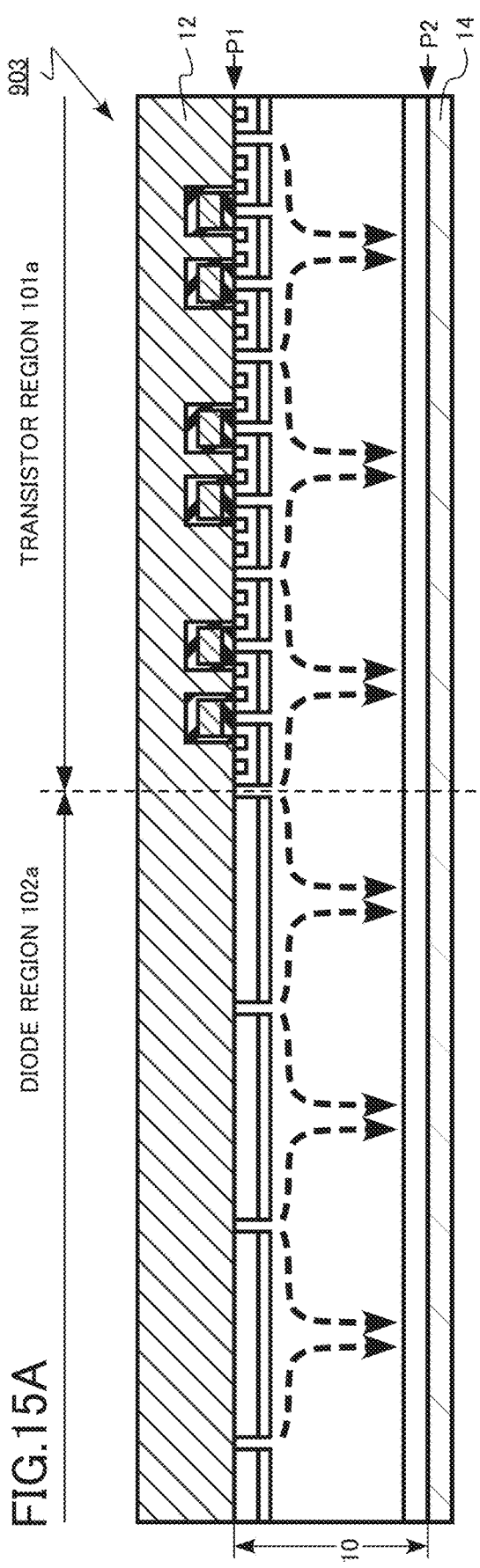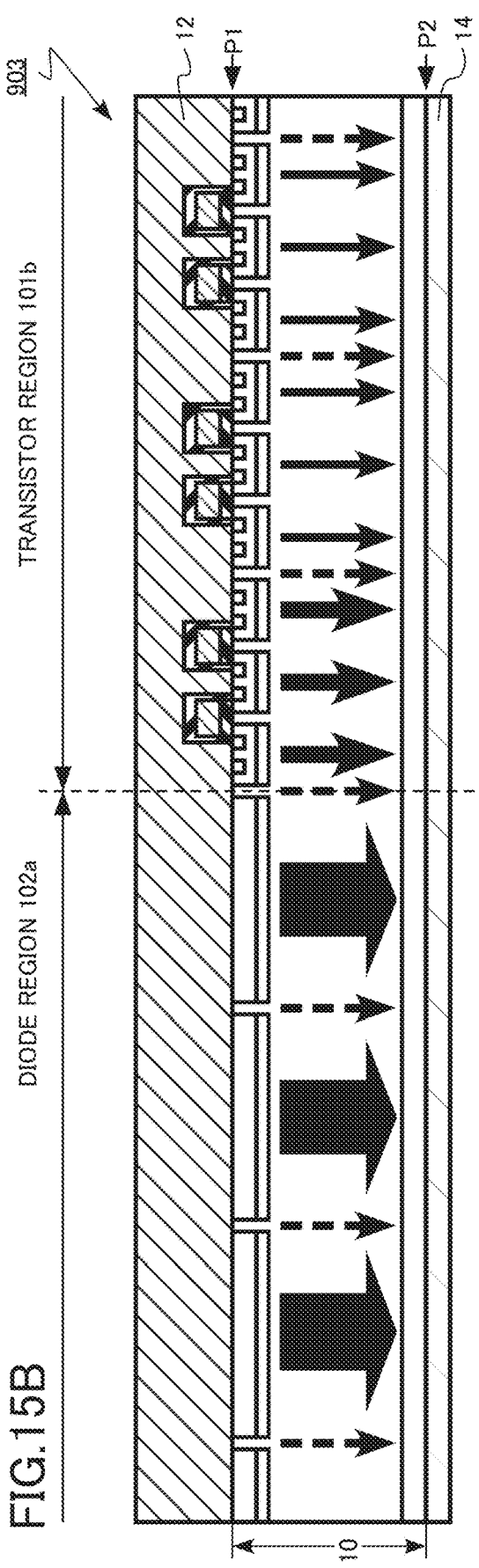

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2022-135433, filed on Aug. 26, 2022, the entire contents of which are incorporated herein by reference.

FIELD

Embodiments described herein relate generally to a semiconductor device, an inverter circuit, a driving device, a vehicle, and an elevator.

BACKGROUND

Silicon carbide (SiC) is expected as a material for a next-generation semiconductor device. As compared with silicon, silicon carbide has excellent physical properties such as a band gap of three times, a breakdown field strength of about ten times, and a thermal conductivity of about three times. By utilizing this characteristic, for example, a metal oxide semiconductor field effect transistor (MOSFET) capable of operating at a high breakdown voltage, a low loss, and a high temperature can be realized.

A vertical MOSFET using silicon carbide includes a pn junction diode as a built-in diode. For example, the MOSFET is used as a switching element connected to an inductive load. In this case, even when the MOSFET is turned off, it is possible to allow a reflux current to flow using the built-in diode.

However, when a reflux current is caused to flow using a body diode, there is a problem in that a stacking fault grows in a silicon carbide layer due to recombination energy of carriers, and on-resistance of the MOSFET increases. An increase in on-resistance of the MOSFET causes a decrease in reliability of the MOSFET. For example, by providing a Schottky Barrier Diode (SBD) that performs unipolar operation as a built-in diode in the MOSFET, it is possible to suppress growth of the stacking fault in the silicon carbide layer. The reliability of the MOSFET is improved by providing the SBD as a built-in diode in the MOSFET.

A large surge current may flow into the MOSFET instantaneously beyond the steady state. When a large surge current flows, a large surge voltage is applied to generate heat, and the MOSFET is broken. The maximum allowable peak current value ($I_{FSM}$) of the surge current allowed in the MOSFET is referred to as a surge current tolerance. In the MOSFET having the SBD provided therein, it is desired to improve a surge current tolerance.

BRIEF DESCRIPTION OF THE DRAWINGS

FIGS. 1A and 1B are schematic top views of a semiconductor device according to a first embodiment;

FIGS. 4A and 4B are schematic cross-sectional views of the semiconductor device according to the first embodiment;

FIGS. 6A and 6B are schematic top views of the semiconductor device according to the first embodiment;

FIG. 7 is a schematic cross-sectional view of the semiconductor device according to the first embodiment;

FIGS. 12A and 12B are explanatory diagrams of a function and an effect of the semiconductor device according to the first embodiment;

FIG. 13 is a schematic cross-sectional view of a semiconductor device according to a second comparative example;

FIGS. 15A and 15B are explanatory diagrams of the function and the effect of the semiconductor device according to the first embodiment;

DETAILED DESCRIPTION

Figure 2:
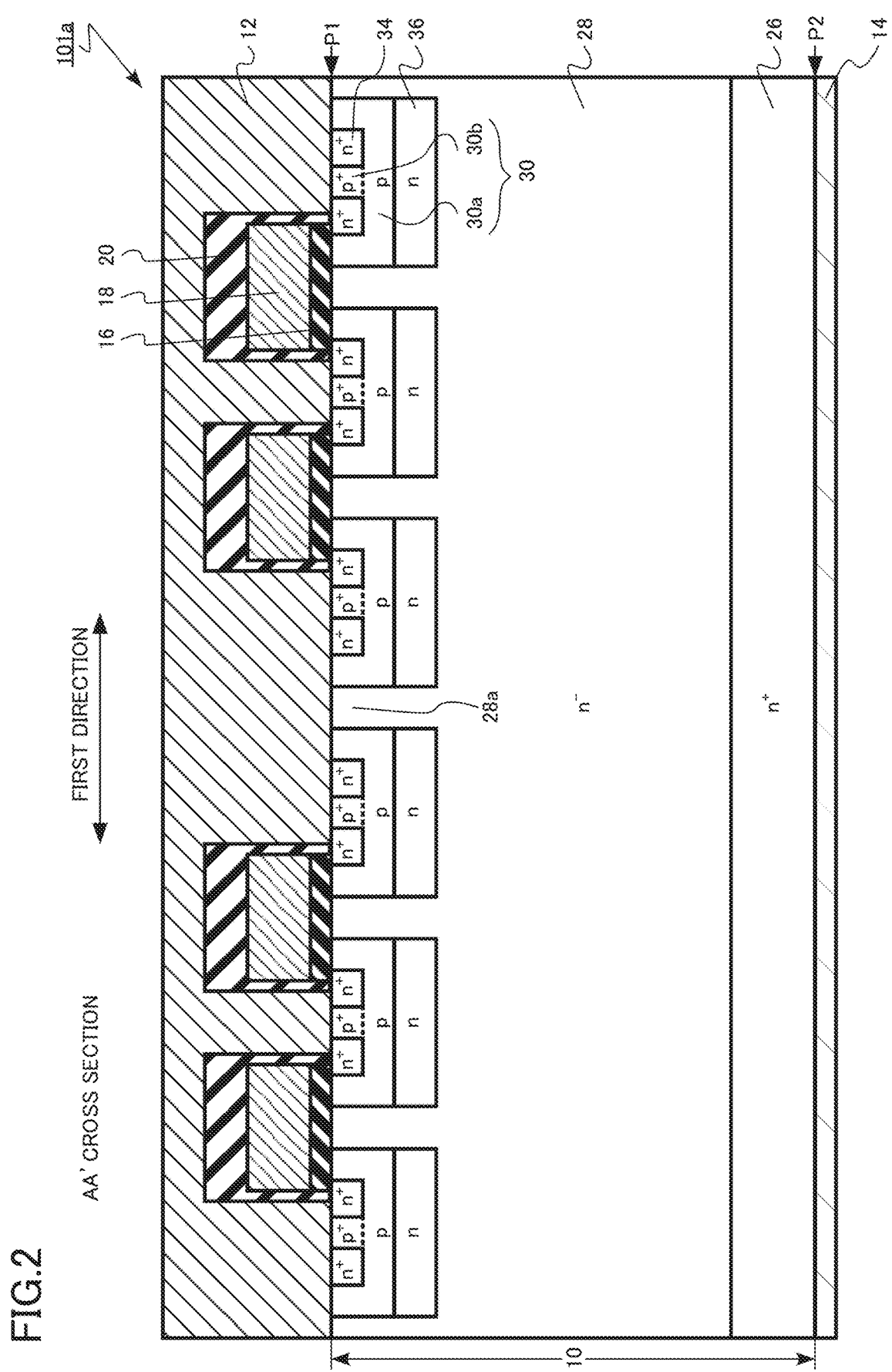
FIG. 2 is a schematic cross-sectional view of the semiconductor device according to the first embodiment.

A semiconductor device according to an embodiment includes a plurality of transistor regions, at least one diode region, and a peripheral region surrounding the transistor regions and the at least one diode region, in which the transistor regions include a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane, a first electrode in contact with the first portions, the second silicon carbide region, and the third silicon carbide region, a second electrode in contact with the second plane, a gate electrode facing the second silicon carbide region, and a gate insulating layer provided between the gate electrode and the second silicon carbide region, the at least one diode region includes the silicon carbide layer including the first silicon carbide region of n-type having a plurality of second portions in contact with the first plane and a fourth silicon carbide region of p-type provided between the first silicon carbide region and the first plane, the first electrode in contact with the second portions and the fourth silicon carbide region, and the second electrode, the peripheral region includes the silicon carbide layer, a gate electrode pad provided on a side of the first plane with respect to the silicon carbide layer, a gate wiring configured to electrically connect the gate electrode pad to the gate electrode and formed to extend in a first direction parallel to the first plane, and an inorganic insulating layer provided between the first electrode and the gate wiring in a second direction parallel to the first plane and perpendicular to the first direction, an occupied area per unit area of the fourth silicon carbide region projected onto the first plane is larger than an occupied area per the unit area of the second silicon carbide region projected onto the first plane, and a first diode region, which is one of the at least one diode region, is provided between a first transistor region, which is one of the transistor regions, and a second transistor region, which is one of the transistor regions provided in the first direction with respect to the first transistor region.

Hereinafter, embodiments of the present disclosure will be described with reference to the drawings. In the following description, the same or similar members and the like are denoted by the same reference numerals, and the description of the members and the like once described may be appropriately omitted.

In the following description, when notations of n$^+$, n, and n$^-$ and p$^+$, p, and p$^-$ are used, the above notations represent relative levels of impurity concentration in each conductive type. That is, n$^+$ indicates that the n-type impurity concentration is relatively higher than n, and n$^-$ indicates that the n-type impurity concentration is relatively lower than n. In addition, p$^+$ indicates that the p-type impurity concentration is relatively higher than p, and p$^-$ indicates that the p-type impurity concentration is relatively lower than p. In addition, an n$^+$ type and an n$^-$ type may be simply referred to as an n type, and a p$^+$ type and a p$^-$ type may be simply referred to as a p type.

The impurity concentration can be measured by, for example, secondary ion mass spectrometry (SIMS). Further, the relative level of the impurity concentration can also be determined from the level of carrier concentration obtained by, for example, scanning capacitance microscopy (SCM). In addition, distances such as a depth and a thickness of an impurity region can be obtained by, for example, SIMS. Furthermore, distances such as a depth, a thickness, a width, and an interval of the impurity region can be obtained from, for example, a composite image of an SCM image and an atomic force microscope (AFM) image.

In the present specification, impurity concentration of a semiconductor region means the maximum impurity concentration of the semiconductor region unless otherwise stated.

First Embodiment

A semiconductor device according to a first embodiment includes a plurality of transistor regions, at least one diode region, and a peripheral region surrounding the plurality of transistor regions and the at least one diode region. The plurality of transistor regions include a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane, a first electrode in contact with the plurality of first portions, the second silicon carbide region, and the third silicon carbide region, a second electrode in contact with the second plane, a gate electrode facing the second silicon carbide region, and a gate insulating layer provided between the gate electrode and the second silicon carbide region. The at least one diode region includes the silicon carbide layer including the first silicon carbide region of n-type having a plurality of second portions in contact with the first plane, and a fourth silicon carbide region of p-type provided between the first silicon carbide region and the first plane, the first electrode in contact with the plurality of second portions and the fourth silicon carbide region, and the second electrode. The peripheral region includes the silicon carbide layer, a gate electrode pad provided on a side of the first plane with respect to the silicon carbide layer, a gate wiring configured to electrically connect the gate electrode pad to the gate electrode and formed to extend in a first direction parallel to the first plane, and an inorganic insulating layer provided between the first electrode and the gate wiring in a second direction parallel to the first plane and perpendicular to the first direction. An occupied area per unit area of the fourth silicon carbide region projected onto the first plane is larger than an occupied area per unit area of the second silicon carbide region projected onto the first plane. Furthermore, a first diode region, which is one of the at least one diode region, is provided between a first transistor region, which is one of the plurality of transistor regions, and a second transistor region, which is one of the plurality of transistor regions provided in the first direction with respect to the first transistor region.

The semiconductor device according to the first embodiment is a vertical MOSFET 100 of a planar gate type using silicon carbide. The MOSFET 100 of the first embodiment is, for example, a double implantation MOSFET (DIMOSFET) in which a body region and a source region are formed by ion implantation. In addition, the semiconductor device according to the first embodiment includes a Schottky barrier diode (SBD) as a built-in diode. The MOSFET 100 is a vertical MOSFET of an n-channel type using electrons as carriers.

FIGS. 1A and 1B are schematic top views of the semiconductor device according to the first embodiment. FIG. 1A is an arrangement diagram of each region provided in the MOSFET 100. FIG. 1B is a diagram illustrating a pattern of an electrode and a wiring on the upper face of the MOSFET 100.

FIG. 2 is a schematic cross-sectional view of the semiconductor device according to the first embodiment. FIG. 2 is a cross-sectional view taken along line A-A' in FIG. 1A.

Figure 3:
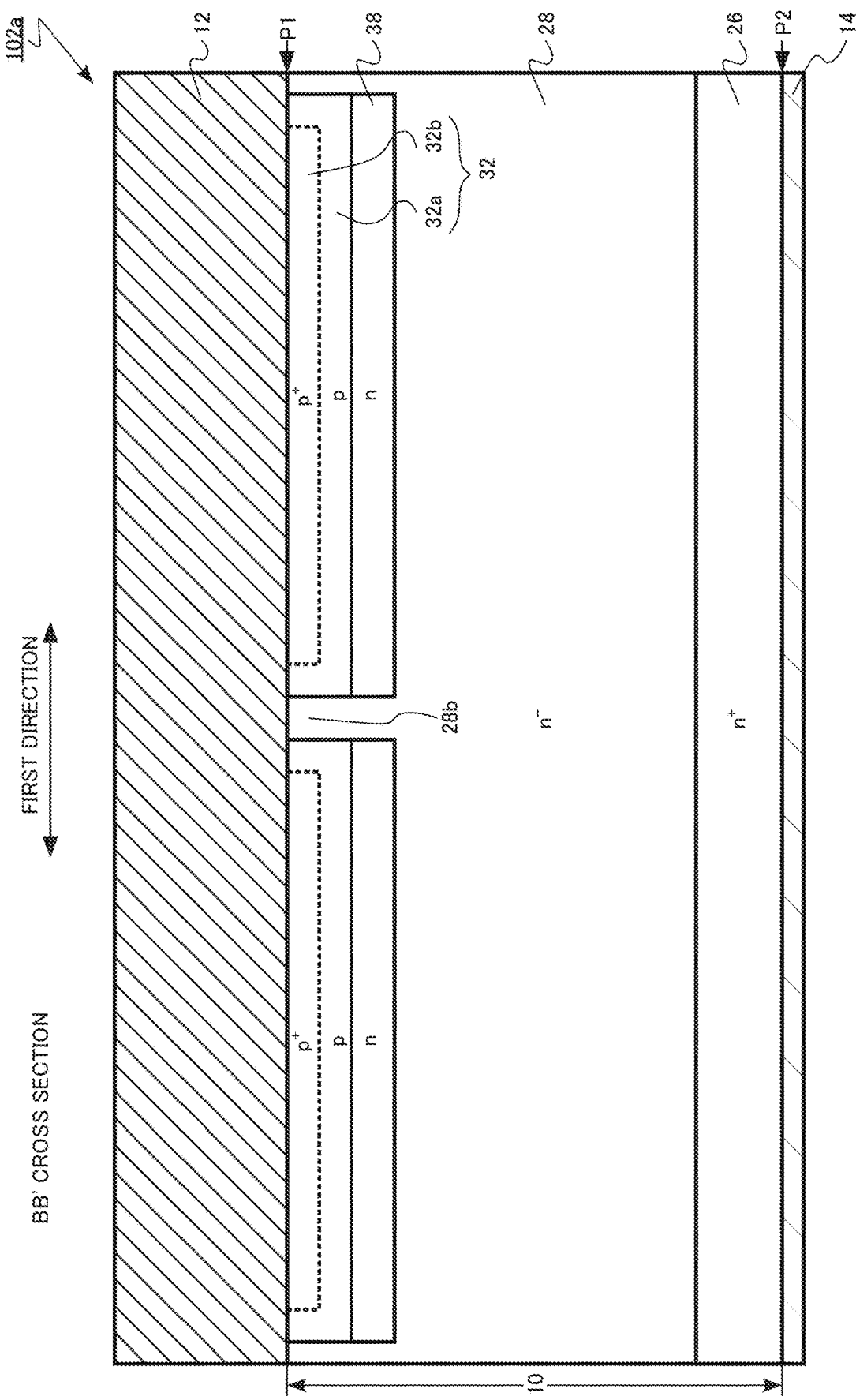
FIG. 3 is a schematic cross-sectional view of the semiconductor device according to the first embodiment.

FIG. 3 is a schematic cross-sectional view of the semiconductor device according to the first embodiment. FIG. 3 is a cross-sectional view taken along line B-B' in FIG. 1A.

FIGS. 4A and 4B are schematic cross-sectional views of the semiconductor device according to the first embodiment. FIG. 4A is a cross-sectional view taken along line C-C' in FIG. 1A. FIG. 4B is a cross-sectional view taken along line D-D' in FIG. 1A.

As illustrated in FIG. 1A, the MOSFET 100 includes a transistor region 101a (first transistor region), a transistor region 101b (second transistor region), a transistor region 101c, a transistor region 101d, a diode region 102a (first diode region), a diode region 102b, and a peripheral region 103. The transistor region 101a is an example of a first transistor region. The transistor region 101b is an example of a second transistor region. The diode region 102a is an example of a first diode region.

Hereinafter, the transistor region 101a, the transistor region 101b, the transistor region 101c, and the transistor region 101d may be simply referred to as a transistor region 101 individually or collectively. In addition, the diode region 102a and the diode region 102b may be simply referred to as a diode region 102 individually or collectively.

The MOSFET and the SBD are provided in the transistor region 101. The SBD is provided in the diode region 102. The MOSFET is not provided in the diode region 102.

The peripheral region 103 surrounds the transistor region 101 and the diode region 102. In the peripheral region 103, a gate electrode pad 22 and a gate wiring 24 are provided.

In the peripheral region 103, for example, a termination structure for improving breakdown voltage of the MOSFET 100 is provided. The termination structure for improving the breakdown voltage of the MOSFET 100 is, for example, a RESURF or a guard ring.

The diode region 102 is provided between the two transistor regions 101. For example, the diode region 102a is provided between the transistor region 101a and the transistor region 101b. The transistor region 101b is provided in the first direction parallel to a first plane P1 with respect to the transistor region 101a.

For example, the diode region 102b is provided between the transistor region 101c and the transistor region 101d. The transistor region 101d is provided in the first direction with respect to the transistor region 101c.

The width of the diode region 102 in the first direction is, for example, 30 μm or more. For example, the width of the diode region 102a in the first direction is 30 μm or more.

The MOSFET 100 includes a silicon carbide layer 10, a source electrode 12 (first electrode), a drain electrode 14 (second electrode), a gate insulating layer 16, a gate electrode 18, an interlayer insulating layer 20, the gate electrode pad 22, the gate wiring 24, a substrate insulating layer 40, and an inorganic insulating layer 42.

The silicon carbide layer 10 includes a drain region 26 of an n$^+$-type, a drift region 28 of an n$^-$-type (first silicon carbide region), a body region 30 of a p$^-$ type (second silicon carbide region), a p region 32 of the p-type (fourth silicon carbide region), a source region 34 of the n$^+$-type (third silicon carbide region), a first bottom region 36 of an n-type (fifth silicon carbide region), and a second bottom region 38 of the n-type (sixth silicon carbide region).

The drift region 28 includes a plurality of first portions 28a and a plurality of second portions 28b. The body region 30 includes a low-concentration portion 30a and a high-concentration portion 30b. The p region 32 includes a low-concentration portion 32a and a high-concentration portion 32b.

The silicon carbide layer 10 is provided between the source electrode 12 and the drain electrode 14. The silicon carbide layer 10 is provided between the gate electrode 18 and the drain electrode 14. The silicon carbide layer 10 is single crystal SiC. The silicon carbide layer 10 is, for example, 4H—SiC.

The silicon carbide layer 10 includes a first plane ("P1" in FIG. 2) and a second plane ("P2" in FIG. 2). The first plane P1 and the second plane P2 face each other. Hereinafter, the first plane may be referred to as a surface, and the second plane may be referred to as a back surface. Hereinafter, the "depth" means a depth based on the first plane.

The first plane P1 is, for example, a face inclined at 0° or more and 8° or less with respect to the (0001) face. In addition, the second plane P2 is, for example, a face inclined at 0° or more and 8° or less with respect to the (000-1) face. The (0001) face is referred to as a silicon face. The (000-1) face is referred to as a carbon face.

The drain region 26 of the n$^+$-type is provided on the back surface side of the silicon carbide layer 10. The drain region 26 contains, for example, nitrogen (N) as an n-type impurity. The n-type impurity concentration of the drain region 26 is, for example, $1\times10^{18}$ cm$^{-3}$ or more and $1\times10^{21}$ cm$^{-3}$ or less.

The drift region 28 of the n$^-$-type is provided between the drain region 26 and the first plane P1. The drift region 28 is provided between the source electrode 12 and the drain electrode 14. The drift region 28 is provided between the gate electrode 18 and the drain electrode 14.

The drift region 28 is provided on the drain region 26. The drift region 28 contains, for example, nitrogen (N) as an n-type impurity. The n-type impurity concentration of the drift region 28 is lower than the n$^-$ type impurity concentration of the drain region 26. The n$^-$ type impurity concentration of the drift region 28 is, for example, $4\times10^{14}$ cm$^{-3}$ or more and $1\times10^{17}$ cm$^{-3}$ or less. The thickness of the drift region 28 is, for example, 5 μm or more and 150 μm or less.

The drift region 28 includes a plurality of first portions 28a and a plurality of second portions 28b. The first portion 28a is in contact with the first plane P1. The first portion 28a is sandwiched between the two body regions 30. The first portion 28a functions as an n-type semiconductor region of the SBD.

The second portion 28b is in contact with the first plane P1. The second portion 28b is sandwiched between the two p regions 32. The second portion 28b functions as an n-type semiconductor region of the SBD.

The body region 30 of the p-type is provided between the drift region 28 and the first plane P1. A part of the body region 30 functions as a channel region of the MOSFET 100. The body region 30 functions as a p-type semiconductor region of a pn junction diode.

The body region 30 includes a low-concentration portion 30a and a high-concentration portion 30b. The high-concentration portion 30b is provided between the low-concentration portion 30a and the first plane P1. The p$^-$ type impurity concentration of the high-concentration portion 30b is higher than the p-type impurity concentration of the low-concentration portion 30a.

The body region 30 contains, for example, aluminum (Al) as a p-type impurity. The p-type impurity concentration of the low-concentration portion 30a is, for example, $1\times10^{16}$ cm$^{-3}$ or more and 5×10$^{17}$ cm$^{-3}$ or less. The p-type impurity concentration of the high-concentration portion 30b is, for example, 1×10$^{18}$ cm$^{-3}$ or more and 1×10$^{21}$ cm$^{-3}$ or less.

The depth of the body region 30 is, for example, 0.3 µm or more and 1.0 µm or less.

The body region 30 is fixed to the electric potential of the source electrode 12.

The p region 32 of the p-type is provided between the drift region 28 and the first plane P1. The p region 32 functions as a p-type semiconductor region of a pn junction diode.

The p region 32 includes a low-concentration portion 32a and a high-concentration portion 32b. The high-concentration portion 32b is provided between the low-concentration portion 32a and the first plane P1. The p$^-$ type impurity concentration of the high-concentration portion 32b is higher than the p-type impurity concentration of the low-concentration portion 32a.

The p region 32 contains, for example, aluminum (Al) as a p-type impurity. The p-type impurity concentration of the low-concentration portion 32a is, for example, 1×10$^{16}$ cm$^{-3}$ or more and 5×10$^{17}$ cm$^{-3}$ or less. The p-type impurity concentration of the high-concentration portion 32b is, for example, 1×10$^{18}$ cm$^{-3}$ or more and 1×10$^{21}$ cm$^{-3}$ or less.

The p-type impurity concentration of the low-concentration portion 32a of the p region 32 is substantially equal to, for example, the p-type impurity concentration of the low-concentration portion 30a of the body region 30.

The p-type impurity concentration of the high-concentration portion 32b of the p region 32 is substantially equal to, for example, the p-type impurity concentration of the high-concentration portion 30b of the body region 30.

For example, the width of the p region 32 in the first direction is larger than the width of the body region in the first direction. The depth of the p region 32 is, for example, 0.3 µm or more and 1.0 µm or less.

The p region 32 is fixed to the electric potential of the source electrode 12.

The source region 34 of the n$^+$-type is provided between the body region 30 and the first plane P1. The source region 34 is provided between the low-concentration portion 30a of the body region 30 and the first plane P1.

The source region 34 contains, for example, phosphorus (P) as an n-type impurity. The n-type impurity concentration of the source region 34 is higher than the n$^-$ type impurity concentration of the drift region 28.

The n-type impurity concentration of the source region 34 is, for example, 1×10$^{18}$ cm$^{-3}$ or more and 1×10$^{21}$ cm$^{-3}$ or less. The depth of the source region 34 is shallower than the depth of the body region 30. The depth of the source region 34 is, for example, 0.1 µm or more and 0.3 µm or less.

The first bottom region 36 of the n-type is provided between the drift region 28 and the body region 30. The first bottom region 36 is in contact with, for example, the drift region 28 and the body region 30. The width of the first bottom region 36 in the first direction is, for example, substantially the same as the width of the body region 30 in the first direction.

The first bottom region 36 contains, for example, nitrogen (N) as an n-type impurity. The n-type impurity concentration of the first bottom region 36 is higher than the n-type impurity concentration of the drift region 28.

The n-type impurity concentration of the first bottom region 36 is, for example, 1×10$^{16}$ cm$^{-3}$ or more and 2×10$^{17}$ cm$^{-3}$ or less. The thickness of the first bottom region 36 is, for example, 0.4 µm or more and 1.5 µm or less.

The second bottom region 38 of the n-type is provided between the drift region 28 and the p region 32. The second bottom region 38 is in contact with, for example, the drift region 28 and the p region 32. The width of the second bottom region 38 in the first direction is, for example, substantially the same as the width of the p region 32 in the first direction.

The second bottom region 38 contains, for example, nitrogen (N) as an n-type impurity. The n-type impurity concentration of the second bottom region 38 is higher than the n-type impurity concentration of the drift region 28. The n-type impurity concentration of the second bottom region 38 is, for example, substantially the same as the n$^-$ type impurity concentration of the first bottom region 36.

The n-type impurity concentration of the second bottom region 38 is, for example, 1×10$^{16}$ cm$^{-3}$ or more and 2×10$^{17}$ cm$^{-3}$ or less. The thickness of the second bottom region 38 is, for example, 0.4 µm or more and 1.5 µm or less.

The gate electrode 18 is provided on the first plane P1 side of the silicon carbide layer 10. The gate electrode 18 extends in the second direction parallel to the first plane P1 and perpendicular to the first direction. A plurality of gate electrodes 18 are disposed in parallel in the first direction. The gate electrode 18 has a so-called stripe shape.

The gate electrode 18 is a conductive layer. The gate electrode 18 is, for example, polycrystalline silicon containing p-type impurities or n-type impurities.

The gate electrode 18 faces, for example, a portion of the body region 30 in contact with the first plane P1. The gate electrode 18 faces, for example, a portion of the drift region 28 in contact with the first plane P1.

The gate insulating layer 16 is provided between the gate electrode 18 and the body region 30. The gate insulating layer 16 is provided between the gate electrode 18 and the drift region 28.

The gate insulating layer 16 is, for example, silicon oxide. For example, a High-k insulating material (high dielectric constant insulating material) can be applied to the gate insulating layer 16.

The interlayer insulating layer 20 is provided on the gate electrode 18 and the silicon carbide layer 10. The interlayer insulating layer 20 is provided between the gate electrode 18 and the source electrode 12. The interlayer insulating layer 20 has a function of electrically separating the gate electrode 18 and the source electrode 12. The interlayer insulating layer 20 is, for example, silicon oxide.

The source electrode 12 is provided on the first plane P1 side of the silicon carbide layer 10. The source electrode 12 is in contact with the first plane P1.

The source electrode 12 is in contact with the first portion 28a of the drift region 28, the second portion 28b of the drift region 28, the body region 30, the p region 32, and the source region 34.

The source electrode 12 has a first region 12a on the transistor region 101 and a second region 12b on the diode region 102.

The source electrode 12 contains metal. The metal forming the source electrode 12 is, for example, a stacked structure of titanium (Ti) and aluminum (Al).

The portion of the source electrode 12 in contact with the body region 30, the p region 32, and the source region 34 is, for example, metal silicide. Metal silicide is, for example, titanium silicide or nickel silicide. For example, metal silicide is not provided in a portion of the source electrode 12 in contact with the first portion 28a of the drift region 28 and the second portion 28b of the drift region 28.

The junction between the body region 30, the p region 32, and the source region 34 and the source electrode 12 is, for example, an ohmic junction. The junction between the first portion 28a of the drift region 28 and the second portion 28b of the drift region 28 and the source electrode 12 is, for example, a Schottky junction.

The drain electrode 14 is provided on the second plane P2 side of the silicon carbide layer 10. The drain electrode 14 is in contact with the second plane P2. The drain electrode 14 is in contact with the drain region 26.

The drain electrode 14 is, for example, a metal or a metal semiconductor compound. The drain electrode 14 contains, for example, at least one material selected from a group formed of nickel silicide, titanium (Ti), nickel (Ni), silver (Ag), and gold (Au).

The junction between the drain region 26 and the drain electrode 14 is, for example, an ohmic junction.

The gate electrode pad 22 is provided on the first plane P1 side of the silicon carbide layer 10. The gate electrode pad 22 is provided on the interlayer insulating layer 20. The gate electrode pad 22 is provided to implement electrical connection between the outside and the gate electrode 18.

The gate wiring 24 is provided on the first plane P1 side of the silicon carbide layer 10. The gate wiring 24 is connected to the gate electrode pad 22. The gate wiring 24 is electrically connected to the gate electrode 18.

A part of the gate wiring 24 extends in the first direction parallel to the first plane P1. A part of the gate wiring 24 extends in the second direction parallel to the first plane P1 and perpendicular to the first direction.

The gate electrode pad 22 and the gate wiring 24 contain metal. The metal forming the gate electrode pad 22 and the gate wiring 24 is, for example, a stacked structure of titanium (Ti) and aluminum (Al). The gate electrode pad 22 and the gate wiring 24 are formed of, for example, the same metal material as the source electrode 12.

The gate wiring 24 between the two source electrodes 12 extends in the first direction. The source electrode 12 is sandwiched between the two gate wirings 24 extending in the first direction. The source electrode 12 is sandwiched between the two gate wirings 24 extending in the second direction.

As illustrated in FIG. 2, the transistor region 101 includes the silicon carbide layer 10, the source electrode 12 (first electrode), the drain electrode 14 (second electrode), the gate insulating layer 16, the gate electrode 18, and the interlayer insulating layer 20. The silicon carbide layer 10 of the transistor region 101 includes the drain region 26 of the $n^+$-type, the drift region 28 of the $n^-$-type (first silicon carbide region), the body region 30 of the p-type (second silicon carbide region), the source region 34 of the $n^+$-type (third silicon carbide region), and the first bottom region 36 of the $n^-$ type (fifth silicon carbide region). The drift region 28 of the transistor region 101 includes the plurality of first portions 28a.

In the transistor region 101, the source electrode 12, the first portion 28a of the drift region 28, the drain region 26, and the drain electrode 14 form the SBD. The source electrode 12, the body region 30, the first bottom region 36, the drain region 26, and the drain electrode 14 form the pn junction diode.

A first distance (d1 in FIGS. 4A and 4B) between the two first portions 28a adjacent to each other with the body region 30 interposed therebetween is, for example, 3 µm or more and 30 µm or less.

As illustrated in FIG. 3, the diode region 102 includes the silicon carbide layer 10, the source electrode 12 (first electrode), and the drain electrode 14 (second electrode). The silicon carbide layer 10 of the diode region 102 includes the drain region 26 of the $n^+$-type, the drift region 28 of the $n^-$-type (first silicon carbide region), the p region 32 of the p-type (fourth silicon carbide region), and the second bottom region 38 of the $n^-$ type (sixth silicon carbide region). The drift region 28 of the diode region 102 includes the plurality of second portions 28b.

In the diode region 102, the source electrode 12, the second portion 28b of the drift region 28, the drain region 26, and the drain electrode 14 form the SBD. The source electrode 12, the p region 32, the second bottom region 38, the drain region 26, and the drain electrode 14 form the pn junction diode.

A second distance (d2 in FIGS. 4A and 4B) between the two second portions 28b adjacent to each other with the p region 32 interposed therebetween is, for example, 3 µm or more and 30 µm or less. The second distance d2 between the two second portions 28b adjacent to each other with the p region 32 interposed therebetween is, for example, substantially equal to the first distance d1 between the two first portions 28a adjacent to each other with the body region 30 interposed therebetween. The first distance d1 and the second distance d2 are distances in the first direction.

Figure 5:
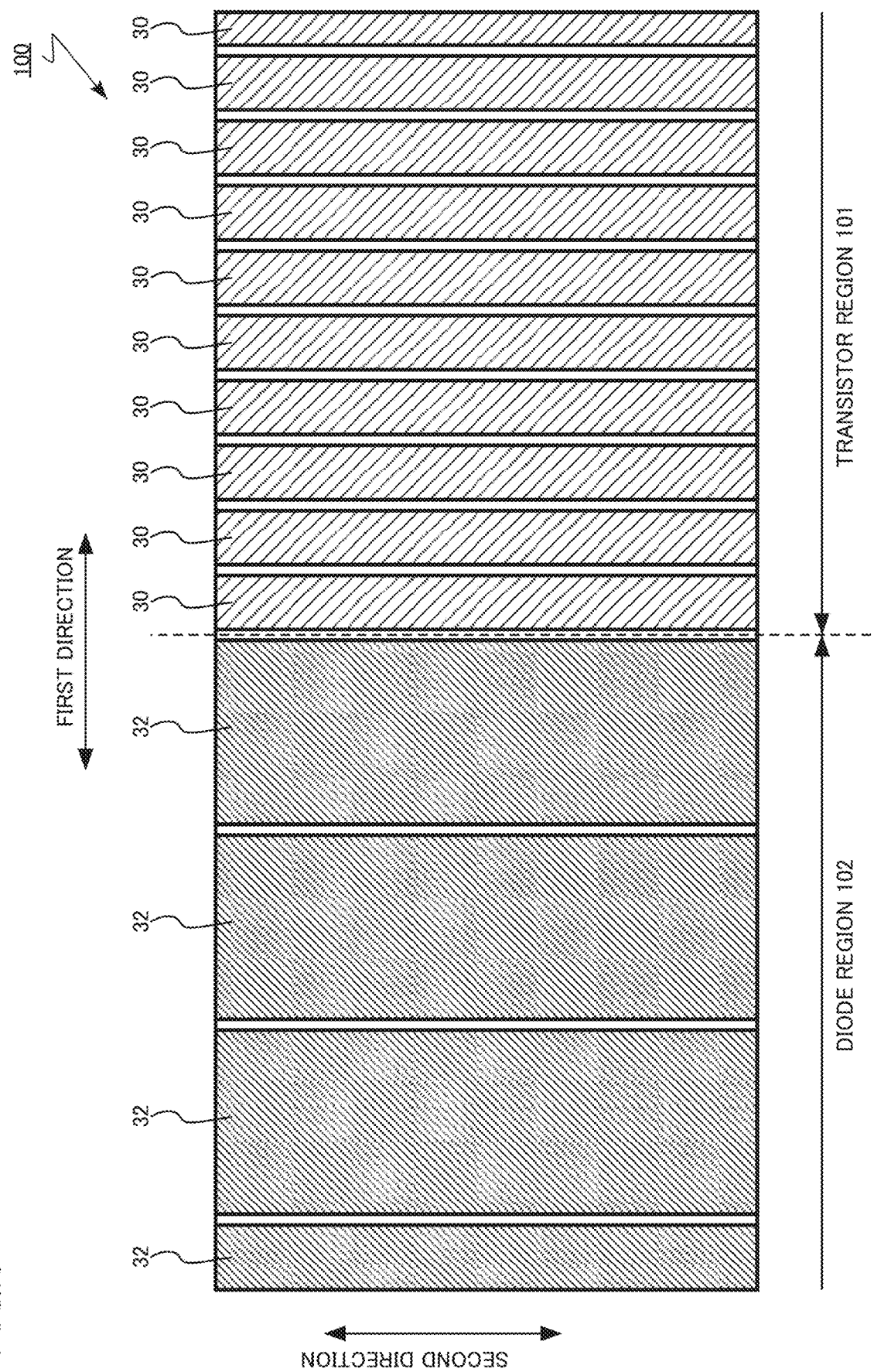
FIG. 5 is a schematic top view of the semiconductor device according to the first embodiment.

FIG. 5 is a schematic top view of the semiconductor device according to the first embodiment. FIG. 5 is a view illustrating a pattern of the body region 30 projected onto the first plane P1 and a pattern of the p region 32 projected onto first plane P1. The pattern of the body region 30 and the pattern of the p region 32 in FIG. 5 are patterns projected onto the first plane P1 in a direction perpendicular to the first plane P1.

An occupancy rate per unit area of the p region 32 projected onto the first plane P1 on the first plane P1 is larger than an occupancy rate per unit area of the body region 30 projected onto the first plane P1 on the first plane P1. In other words, in the region of a predetermined size, the occupancy rate of the p region 32 projected onto the first plane P1 on the first plane P1 is larger than the occupancy rate of the body region 30 projected onto the first plane P1 on the first plane P1. The occupancy rate is an occupancy rate with respect to the transistor region 101 and the diode region 102 projected onto the first plane P1. That is, the occupancy ratio of the pn junction diode in the diode region 102 is larger than the occupancy ratio of the pn junction diode in the transistor region 101.

The occupancy rate per unit area of the p region 32 projected onto the first plane P1 is, for example, 1.2 times or more and 3 times or less the occupancy rate per unit area of the body region 30 projected onto the first plane P1.

The unit area is not particularly limited as long as the average occupancy rate of the body region 30 of the transistor region 101 with the average occupancy rate of the p region 32 of the diode region 102 can be compared. The unit area is, for example, 30 µm×30 µm=900 µm².

In addition, a contact area per unit area between the source electrode 12 and the p region 32 in the diode region 102 is larger than a contact area per unit area between the source electrode 12 and the body region 30 in the transistor region 101. That is, contact resistance per unit area between the source electrode 12 and the p region 32 in the diode region 102 is smaller than contact resistance per unit area between the source electrode 12 and the body region 30 in the transistor region 101.

FIGS. 6A and 6B are schematic top views of the semiconductor device according to the first embodiment. FIG. 6A is an arrangement diagram of each region provided in the MOSFET 100. FIG. 6B is a diagram illustrating a pattern of an electrode and an inorganic insulating layer on the upper face of the MOSFET 100.

FIG. 7 is a schematic cross-sectional view of the semiconductor device according to the first embodiment. FIG. 7 is a cross-sectional view taken along line E-E' in FIGS. 6A and 6B.

Figure 8:
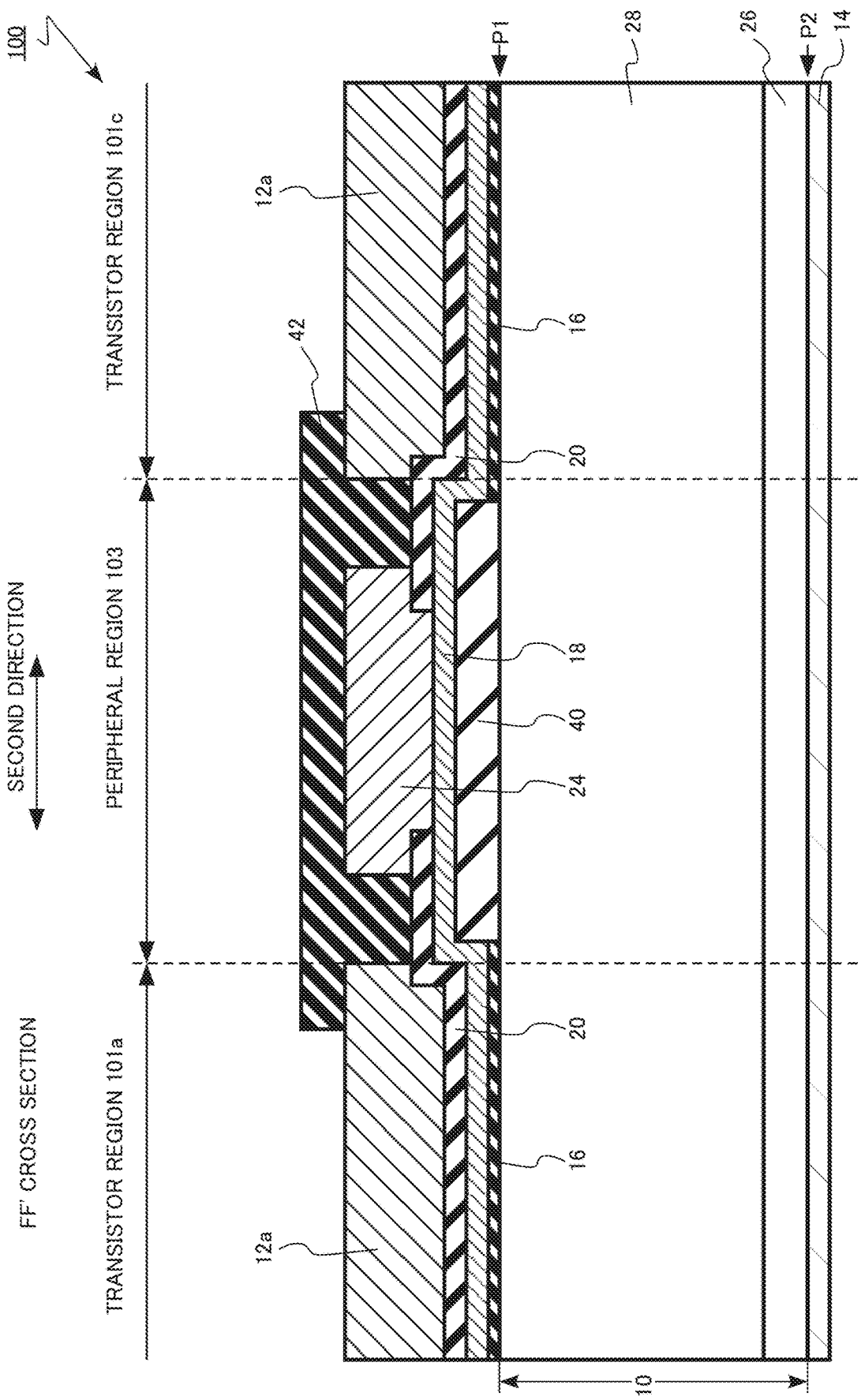
FIG. 8 is a schematic cross-sectional view of the semiconductor device according to the first embodiment.

FIG. 8 is a schematic cross-sectional view of the semiconductor device according to the first embodiment. FIG. 8 is a cross-sectional view taken along line F-F' in FIGS. 6A and 6B.

The substrate insulating layer 40 is provided in the peripheral region 103. The substrate insulating layer is provided on the silicon carbide layer 10. The substrate insulating layer 40 has a function of electrically separating the gate electrode 18 and the silicon carbide layer 10.

The substrate insulating layer 40 contains, for example, an oxide. The substrate insulating layer 40 is, for example, silicon oxide.

The gate electrode 18 is provided on the substrate insulating layer 40. The gate electrode 18 on the substrate insulating layer 40 extends, for example, in the first direction.

The gate wiring 24 is provided on the gate electrode 18. The gate wiring 24 is in contact with the gate electrode 18.

The inorganic insulating layer 42 is provided on the interlayer insulating layer 20, the source electrode 12, the gate electrode pad 22, and the gate wiring 24.

The inorganic insulating layer 42 is provided between the source electrode 12 and the gate wiring 24 in a direction parallel to the first plane P1. The inorganic insulating layer 42 is provided, for example, between the source electrode 12 and the gate wiring 24 in the second direction.

The inorganic insulating layer 42 is in contact with, for example, the upper face of the source electrode 12. The inorganic insulating layer 42 is in contact with, for example, the upper face of the gate wiring 24.

The inorganic insulating layer 42 is in contact with, for example, the side face of the source electrode 12. The inorganic insulating layer 42 is in contact with, for example, the side face of the gate wiring 24. The inorganic insulating layer 42 is provided, for example, between the side face of the source electrode 12 and the side face of the gate wiring 24.

For example, as illustrated in FIG. 7, the inorganic insulating layer 42 is provided between the second region 12b of the source electrode 12 and the gate wiring 24. For example, as illustrated in FIG. 8, the inorganic insulating layer 42 is provided between the first region 12a of the source electrode 12 and the gate wiring 24.

The inorganic insulating layer 42 contains, for example, at least one of an oxide and a nitride. The inorganic insulating layer 42 contains, for example, at least one of silicon oxide and silicon nitride. The inorganic insulating layer 42 has, for example, a stacked structure of a silicon oxide layer and a silicon nitride layer.

Next, functions and effects of the MOSFET 100 of the first embodiment will be described.

Figure 9A:
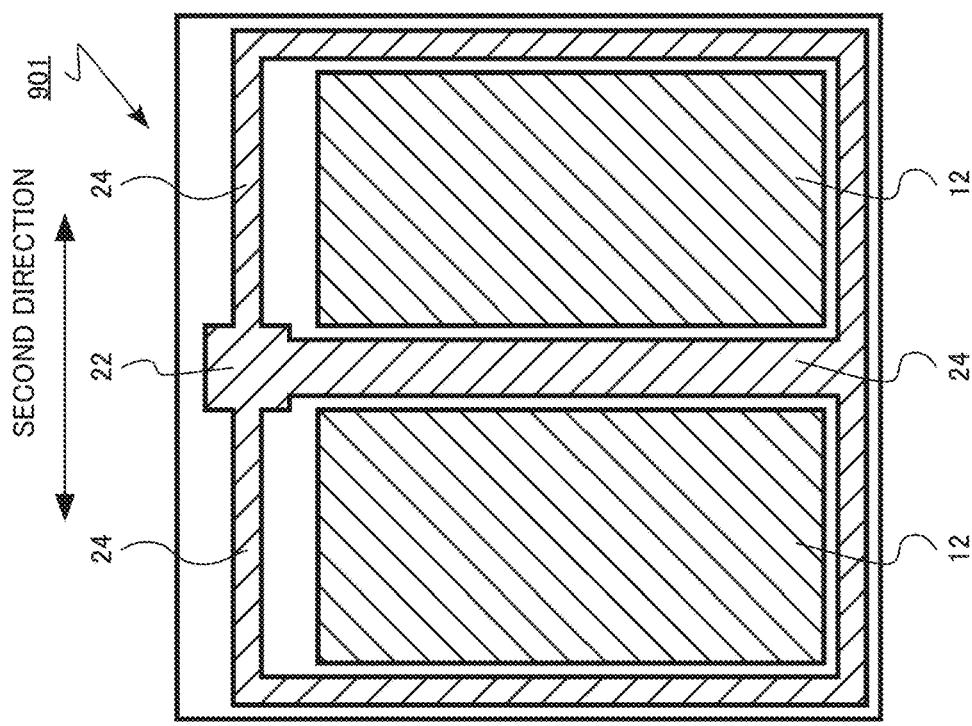
FIGS. 9A and 9B are schematic top views of a semiconductor device according to a first comparative example.
Figure 9B:
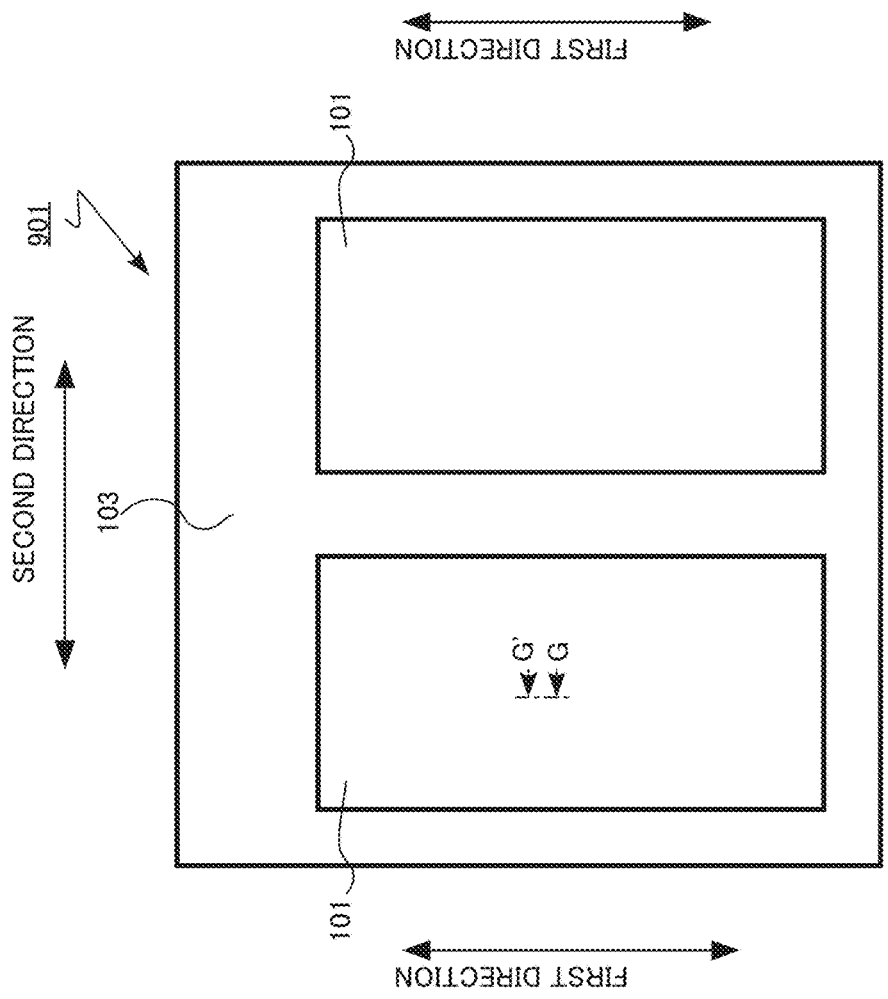

FIGS. 9A and 9B are schematic top views of a semiconductor device of a first comparative example. FIG. 9A is an arrangement diagram of each region provided in an MOSFET 901 of the first comparative example. FIG. 9B is a diagram illustrating a pattern of an electrode and a wiring on the upper face of the MOSFET 901 of the first comparative example. FIGS. 9A and 9B are diagrams corresponding to FIGS. 1A and 1B of the first embodiment.

Figure 10:
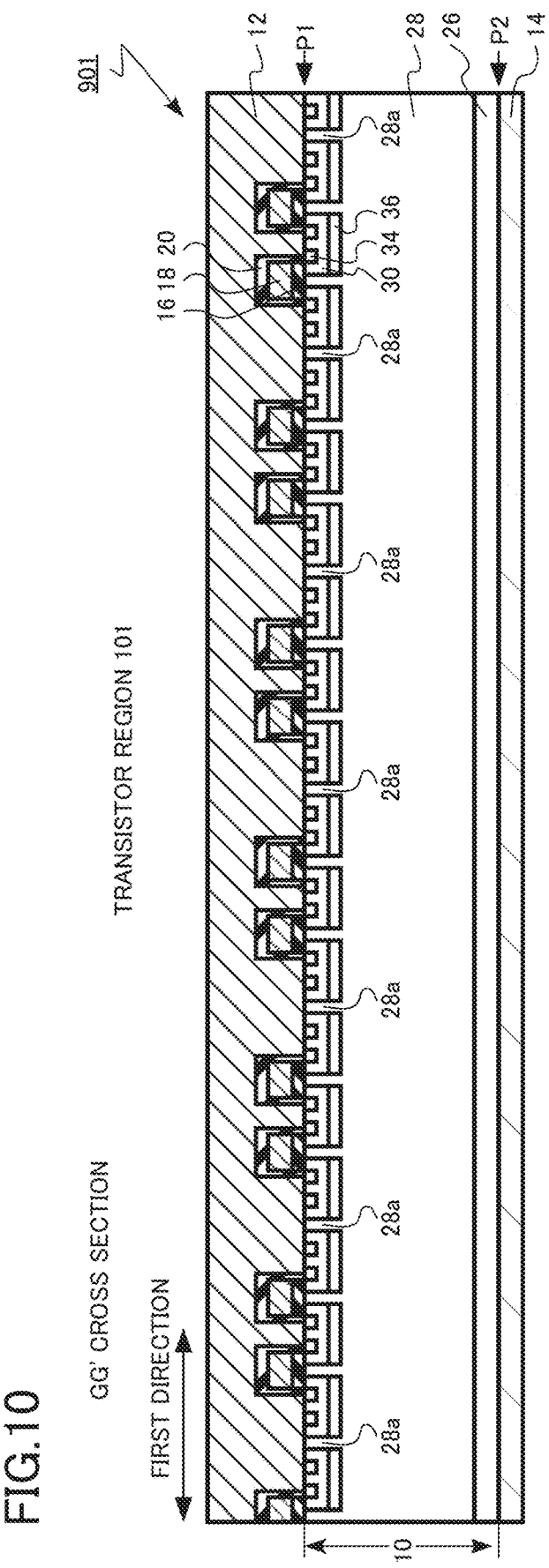
FIG. 10 is a schematic cross-sectional view of the semiconductor device according to the first comparative example.

FIG. 10 is a schematic cross-sectional view of the semiconductor device of the first comparative example. FIG. 10 is a cross-sectional view taken along line G-G' in FIG. 9A. FIG. 10 is a diagram corresponding to FIG. 4A of the first embodiment.

The MOSFET 901 of the first comparative example is different from the MOSFET 100 of the first embodiment in that the diode region 102 is not provided. The MOSFET 901 of the first comparative example is different from the MOSFET 100 of the first embodiment in that the inorganic insulating layer 42 is not provided.

In the transistor region 101 of the MOSFET of the first comparative example, the MOSFET and the SBD are provided in the same manner as that of the MOSFET 100 of the first embodiment.

Figure 11:
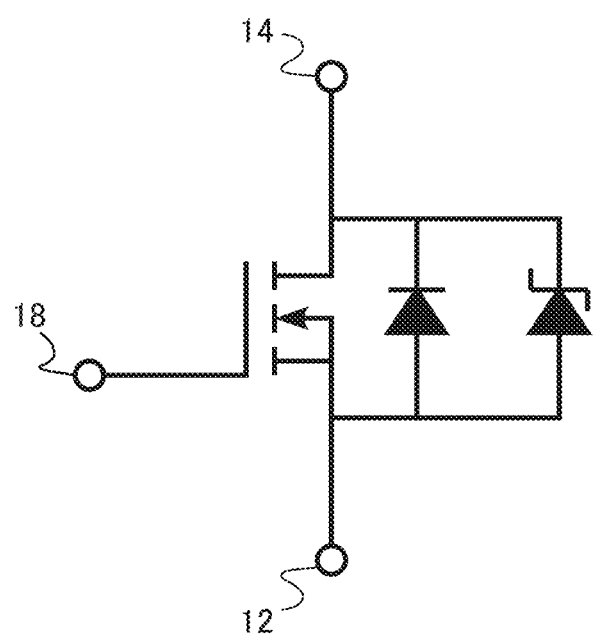
FIG. 11 is an equivalent circuit diagram of the semiconductor device according to the first comparative example.

FIG. 11 is an equivalent circuit diagram of the semiconductor device of the first comparative example. Between the source electrode 12 and the drain electrode 14, the pn junction diode and the SBD are connected as built-in diodes in parallel with the transistor.

For example, a case where the MOSFET 901 is used as a switching element connected to an inductive load will be considered. When the MOSFET 901 is turned off, a voltage at which the source electrode 12 is positive with respect to the drain electrode 14 may be applied due to a load current caused by an inductive load. In this case, a forward current flows through the built-in diode. This state is also referred to as a reverse conduction state.

A forward voltage (Vf) at which a forward current starts flowing through the SBD is lower than a forward voltage (Vf) of the pn junction diode. Therefore, first, the forward current flows through the SBD.

The forward voltage (Vf) of the SBD is, for example, 1.0 V. The forward voltage (Vf) of the pn junction diode is, for example, 2.5 V.

The SBD performs unipolar operation. Therefore, even if a forward current flows, a stacking fault does not grow in the silicon carbide layer 10 due to recombination energy of carriers.

FIGS. 12A and 12B are explanatory diagrams of functions and effects of the semiconductor device according to the first embodiment. FIGS. 12A and 12B are schematic cross-sectional views of the first comparative example. FIGS. 12A and 12B correspond to FIG. 10.

FIGS. 12A and 12B are diagrams illustrating a current flowing through the built-in diode of the MOSFET 901 of the first comparative example. FIG. 12A illustrates a state in which a forward current flows only through the SBD, and FIG. 12B illustrates a state in which a forward current flows through the SBD and the pn junction diode. That is, FIG. 12A illustrates a state in which the voltage applied between the pn junctions of the pn junction diode is lower than the forward voltage (Vf) of the pn junction diode. FIG. 12B illustrates a state in which the voltage applied between the pn junctions of the pn junction diode is higher than the forward voltage (Vf) of the pn junction diode.

In FIGS. 12A and 12B, a dotted arrow indicates a current flowing through the SBD. In FIG. 12B, a solid arrow indicates a current flowing through the pn junction diode.

As illustrated in FIG. 12A, the current flowing through the SBD flows around the bottom portion of the body region 30. Therefore, the electrostatic potential wraps around in the drift region 28 facing the bottom portion of the body region 30. The wraparound of the electrostatic potential reduces the voltage applied between the body region 30 and the drift region 28.

Therefore, at the bottom of the body region 30, the voltage hardly exceeds the forward voltage (Vf) of the pn junction diode. In other words, the forward voltage (Vf) of the pn junction diode of the MOSFET 901 of the first comparative example can be made higher than a case where the SBD is not provided. Therefore, bipolar operation of the pn junction diode is suppressed, and formation of a stacking fault in the silicon carbide layer 10 due to recombination energy of carriers is suppressed.

The forward voltage (Vf) of the pn junction diode of the MOSFET 901 of the first comparative example depends on a distance between two SBDs adjacent to each other in the first direction. By reducing the distance between the two SBDs adjacent to each other in the first direction, the forward voltage (Vf) of the pn junction diode of the MOSFET 901 of the first comparative example can be increased.

A large surge current exceeding a steady state may be instantaneously applied to the MOSFET. The surge current flows from the source electrode 12 toward the drain electrode 14.

When a large surge current flows, a large surge voltage is applied to generate heat, and the MOSFET is broken. The maximum allowable peak current value ($I_{FSM}$) of the surge current allowed in the MOSFET is referred to as a surge current tolerance. In the MOSFET having the SBD provided therein, it is desired to improve a surge current tolerance.

When a large surge voltage is applied to the MOSFET 901 of the first comparative example, the voltage applied between the pn junctions of the pn junction diode is higher than the forward voltage (Vf) of the pn junction diode.

When the voltage applied between the pn junctions of the pn junction diode becomes higher than the forward voltage (Vf) of the pn junction diode, a current also flows through the pn junction diode as illustrated in FIG. 12B.

FIG. 13 is a schematic cross-sectional view of a semiconductor device of a second comparative example. FIG. 13 is a diagram corresponding to FIG. 10 of the first comparative example.

An MOSFET 902 of the second comparative example is different from the MOSFET 901 of the first comparative example in that the transistor region does not include the SBD. The built-in diode of the MOSFET 902 of the second comparative example is only the pn junction diode.

Figure 14:
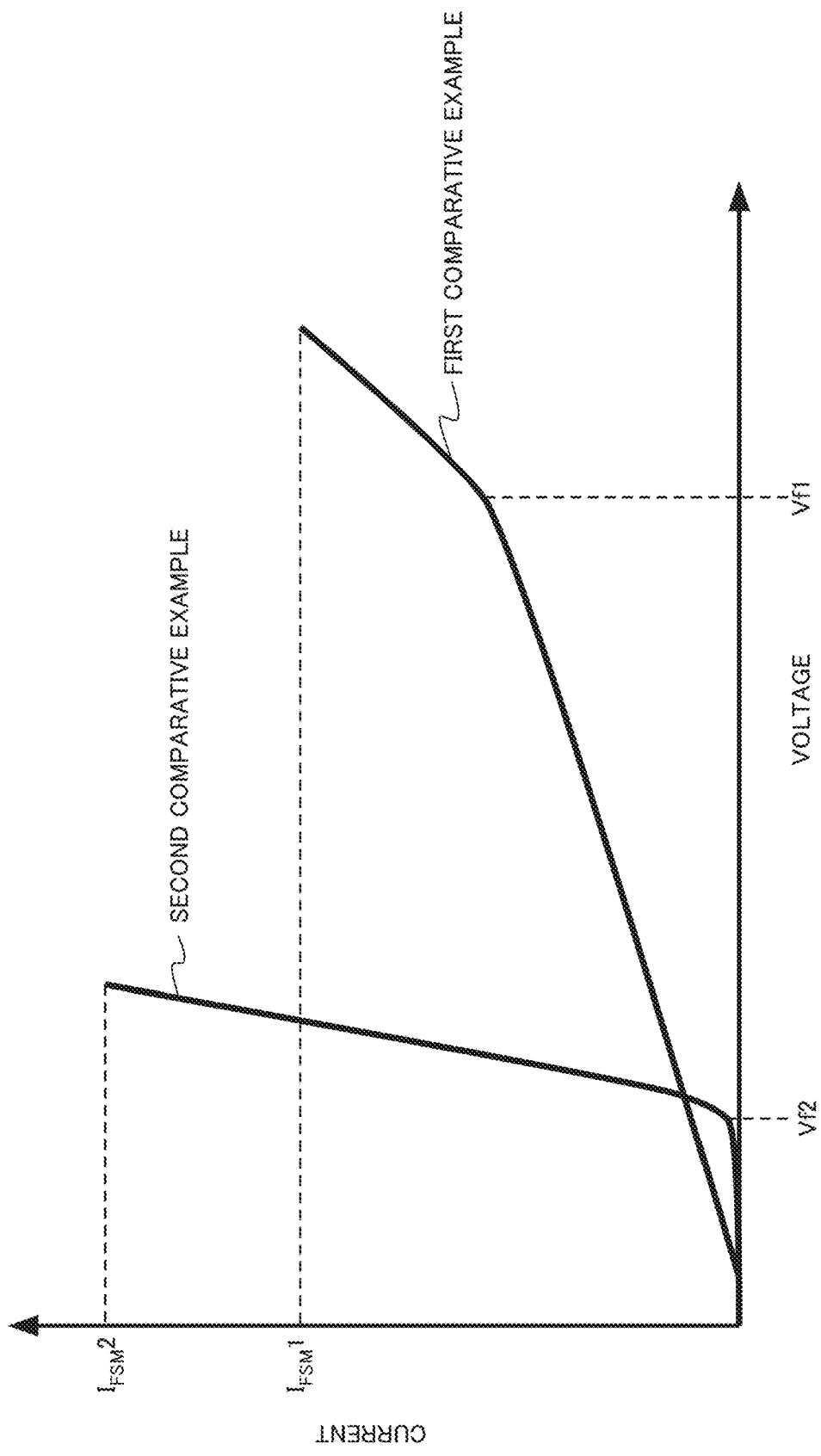
FIG. 14 is an explanatory diagram of the function and the effect of the semiconductor device according to the first embodiment.

FIG. 14 is an explanatory diagram of functions and effects of the semiconductor device according to the first embodiment. FIG. 14 is a diagram illustrating voltage-current characteristics of the built-in diodes of the MOSFET 901 of the first comparative example and the MOSFET 902 of the second comparative example.

As illustrated in FIG. 14, in the MOSFET 902 of the second comparative example, when a voltage equal to or higher than a forward voltage Vf2 of the pn junction diode is applied, a current flows through the pn junction diode. On the other hand, in the MOSFET 901 of the first comparative example, a current flows through the SBD until a forward voltage Vf1 of the pn junction diode is applied. In the MOSFET 901 of the first comparative example, when a voltage equal to or higher than the forward voltage Vf1 of the pn junction diode is applied, a current flows through the pn junction diode.

Since the MOSFET 901 of the first comparative example performs the unipolar operation up to the forward voltage Vf1, the slope of the current increase is smaller than that of the MOSFET 902 of the second comparative example. Therefore, a maximum allowable peak current value $I_{FSM}1$ of the MOSFET 901 of the first comparative example is smaller than a maximum allowable peak current value $I_{FSM}2$ of the MOSFET 902 of the second comparative example. In other words, a surge current tolerance of the MOSFET 901 of the first comparative example is smaller than a surge current tolerance of the MOSFET 902 of the second comparative example.

An MOSFET 903 of a third comparative example is different from the MOSFET 100 of the first embodiment only in that the inorganic insulating layer 42 is not provided.

The MOSFET 903 of the third comparative example includes the diode region 102 provided between the transistor regions 101 in the same manner as that of the MOSFET 100 of the first embodiment. Since the MOSFET 903 of the third comparative example includes the diode region 102, a surge current tolerance is improved. Hereinafter, a description will be given in detail.

FIGS. 15A and 15B are explanatory diagrams of functions and effects of the semiconductor device according to the first embodiment. FIGS. 15A and 15B are schematic cross-sectional views of the MOSFET 903 of the third comparative example. FIGS. 15A and 15B correspond to FIG. 4A.

FIGS. 15A and 15B are diagrams illustrating a current flowing through the built-in diode of the MOSFET 903 of the third comparative example. FIG. 15A illustrates a state in which a forward current flows only through the SBD, and FIG. 15B illustrates a state in which a forward current flows through the SBD and the pn junction diode.

That is, FIG. 15A illustrates a state in which the voltage applied between the pn junctions of the pn junction diode is lower than the forward voltage (Vf) of the pn junction diode. FIG. 15B illustrates a state in which the voltage applied between the pn junctions of the pn junction diode is higher than the forward voltage (Vf) of the pn junction diode.

In FIGS. 15A and 15B, a dotted arrow indicates a current flowing through the SBD. In FIG. 15B, a solid arrow indicates a current flowing through the pn junction diode.

The second distance d2 between the two second portions 28b adjacent to each other with the p region 32 interposed therebetween in the diode region 102 is substantially equal to the first distance d1 between the two first portions 28a adjacent to each other with the body region 30 interposed therebetween in the transistor region 101. In other words, the diode region 102 is provided with the second portion 28b at the same distance as the first portion 28a of the transistor region 101. In other words, an SBD region is provided in the diode region 102 at the same distance as the transistor region 101.

Therefore, as illustrated in FIG. 15A, in the diode region 102, the current flowing through the SBD flows around the bottom portion of the p region 32. Therefore, at the bottom portion of the p region 32, the voltage hardly exceeds the forward voltage (Vf) of the pn junction diode. The forward voltage (Vf) of the pn junction diode in the diode region 102 is increased by providing the SBD region.

When the voltage applied between the pn junctions of the pn junction diode becomes higher than the forward voltage (Vf) of the pn junction diode, a current also flows through the pn junction diode as illustrated in FIG. 15B.

In the MOSFET 903 of the third comparative example, the occupancy rate per unit area of the p region 32 projected onto the first plane P1 is larger than the occupancy rate per unit area of the body region 30 projected onto the first plane P1. That is, the occupancy ratio of the pn junction diode in the diode region 102 is larger than the occupancy ratio of the pn junction diode in the transistor region 101.

In addition, a contact area per unit area between the source electrode 12 and the p region 32 in the diode region 102 is larger than a contact area per unit area between the source electrode 12 and the body region 30 in the transistor region 101. That is, contact resistance per unit area between the source electrode 12 and the p region 32 in the diode region 102 is smaller than contact resistance per unit area between the source electrode 12 and the body region 30 in the transistor region 101.

Therefore, the current flowing through the pn junction diode of the diode region 102 is larger than the current flowing through the pn junction diode of the transistor region 101.

In addition, when a large current flows through the pn junction diode of the diode region 102, carrier propagation and heat propagation to the adjacent transistor region 101 occur. Therefore, conductivity modulation of the transistor region 101 adjacent to the diode region 102 is promoted. Therefore, the current flowing through the pn junction diode of the transistor region 101 adjacent to the diode region 102 increases.

Figure 16:
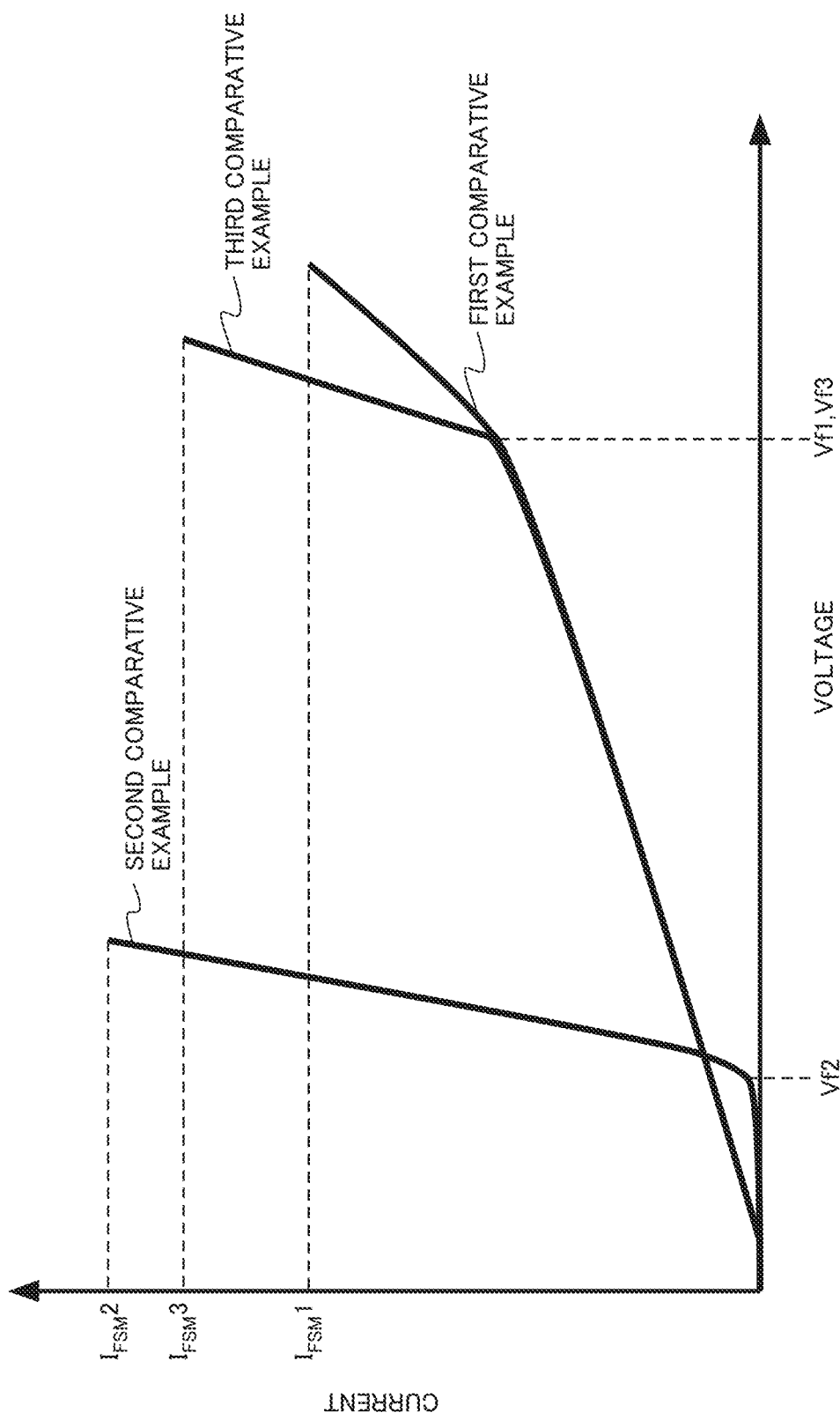
FIG. 16 is an explanatory diagram of the function and the effect of the semiconductor device according to the first embodiment.

FIG. 16 is an explanatory diagram of functions and effects of the semiconductor device according to the first embodiment. FIG. 16 is a diagram illustrating voltage-current characteristics of the built-in diodes of the MOSFET 901 of the first comparative example, the MOSFET 902 of the second comparative example, and the MOSFET 903 of the third comparative example.

As illustrated in FIG. 16, in the MOSFET 903 of the third comparative example, a current flows through the SBD until the forward voltage Vf3 of the pn junction diode is applied. In the MOSFET 903 of the third comparative example, when a voltage equal to or higher than the forward voltage Vf3 of the pn junction diode is applied, a current flows through the pn junction diode.

In the diode region 102 of the MOSFET 903 of the third comparative example, the SBD region is provided at the same distance as the transistor region 101. Therefore, the forward voltage Vf3 of the pn junction diode of the MOSFET 903 of the third comparative example is equal to the forward voltage Vf1 of the pn junction diode of the MOSFET of the first comparative example.

Meanwhile, a current after exceeding the forward voltage Vf3 of the pn junction diode in the MOSFET 903 of the third comparative example is larger than a current after exceeding the forward voltage Vf1 of the pn junction diode in the MOSFET 901 of the first comparative example. This is because the current flowing through the pn junction diode of the diode region 102 and the pn junction diode of the transistor region 101 adjacent to the diode region 102 is larger than that of the MOSFET 901 of the first comparative example.

Since the current after exceeding the forward voltage Vf3 of the pn junction diode increases, a maximum allowable peak current value $I_{FSM}3$ of the MOSFET 903 of the third comparative example becomes larger than the maximum allowable peak current value $I_{FSM}1$ of the MOSFET 901 of the first comparative example. In other words, the surge current tolerance of the MOSFET 903 of the third comparative example is larger than the surge current tolerance of the MOSFET 901 of the first comparative example.

As described above, the MOSFET 903 of the third comparative example includes the diode region 102 provided between the transistor regions 101, thereby improving the surge current tolerance.

The occupancy rate per unit area of the p region 32 projected onto the first plane P1 is preferably 1.2 times or more and 3 times or less the occupancy rate per unit area of the body region 30 projected onto the first plane P1. By exceeding the lower limit value, the surge current tolerance is further improved. In addition, by falling below the upper limit value, a decrease in the forward voltage Vf3 is suppressed, and a decrease in reliability is suppressed.

Figure 17:
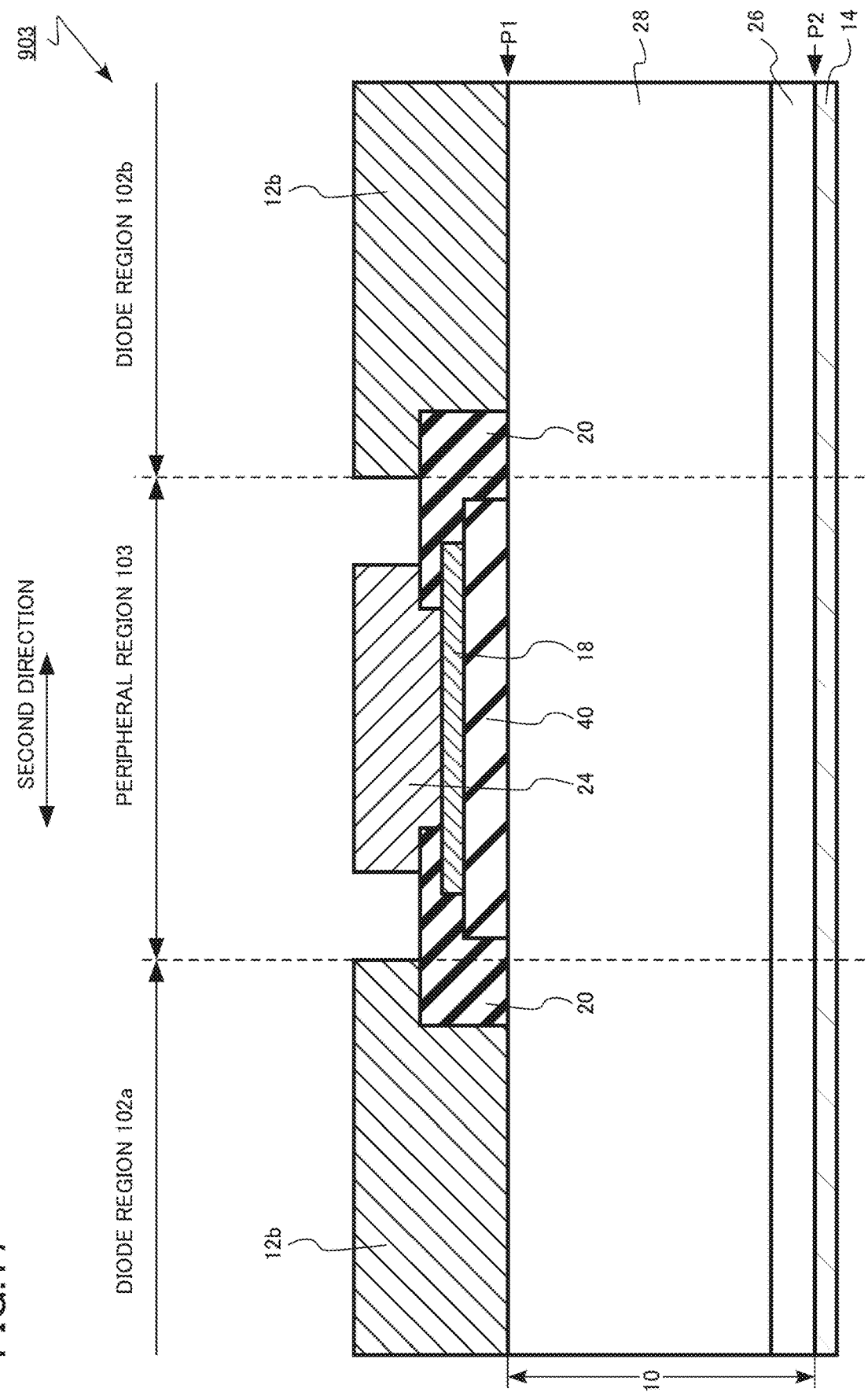
FIG. 17 is a schematic cross-sectional view of a semiconductor device according to a third comparative example.

FIG. 17 is a schematic cross-sectional view of a semiconductor device of the third comparative example. FIG. 17 is a diagram corresponding to FIG. 7 of the first embodiment.

Figure 18:
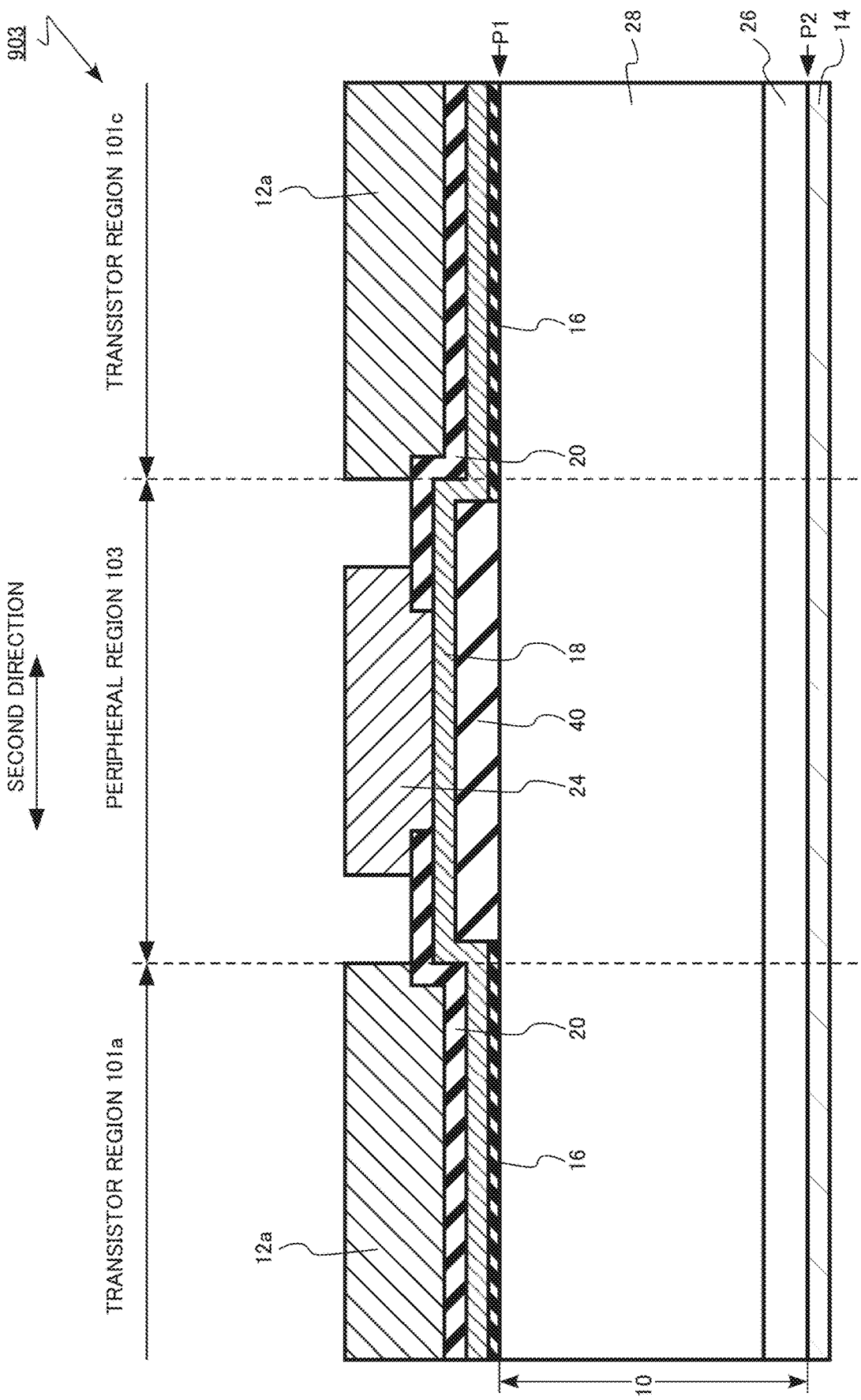
FIG. 18 is a schematic cross-sectional view of the semiconductor device according to the third comparative example.

FIG. 18 is a schematic cross-sectional view of the semiconductor device of the third comparative example. FIG. 18 is a diagram corresponding to FIG. 8 of the first embodiment.

The MOSFET 903 of the third comparative example is different from the MOSFET 100 of the first embodiment in that the inorganic insulating layer 42 is not provided between the source electrode 12 and the gate wiring 24.

In the MOSFET 903 of the third comparative example, for example, no substance exists between the source electrode 12 and the gate wiring 24. In addition, in the MOSFET 903 of the third comparative example, for example, a resin layer (not illustrated) exists between the source electrode 12 and the gate wiring 24. The resin layer is, for example, polyimide.

Figure 19A:
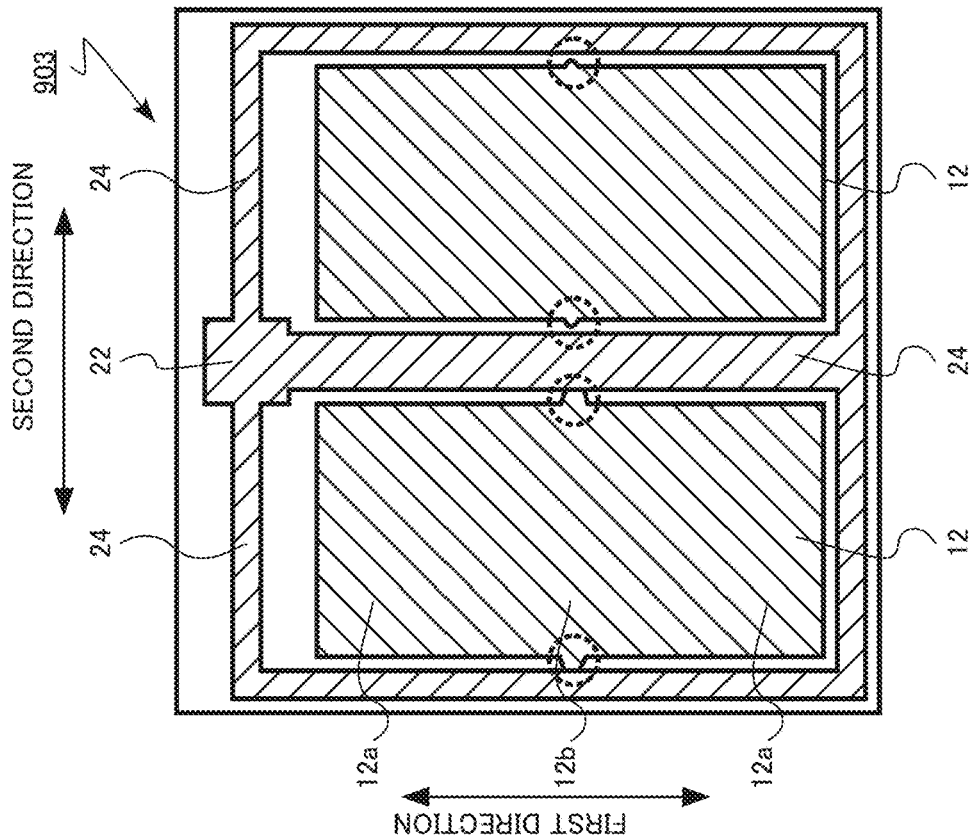
FIGS. 19A and 19B are explanatory diagrams of a problem of the semiconductor device according to the third comparative example.
Figure 19B:
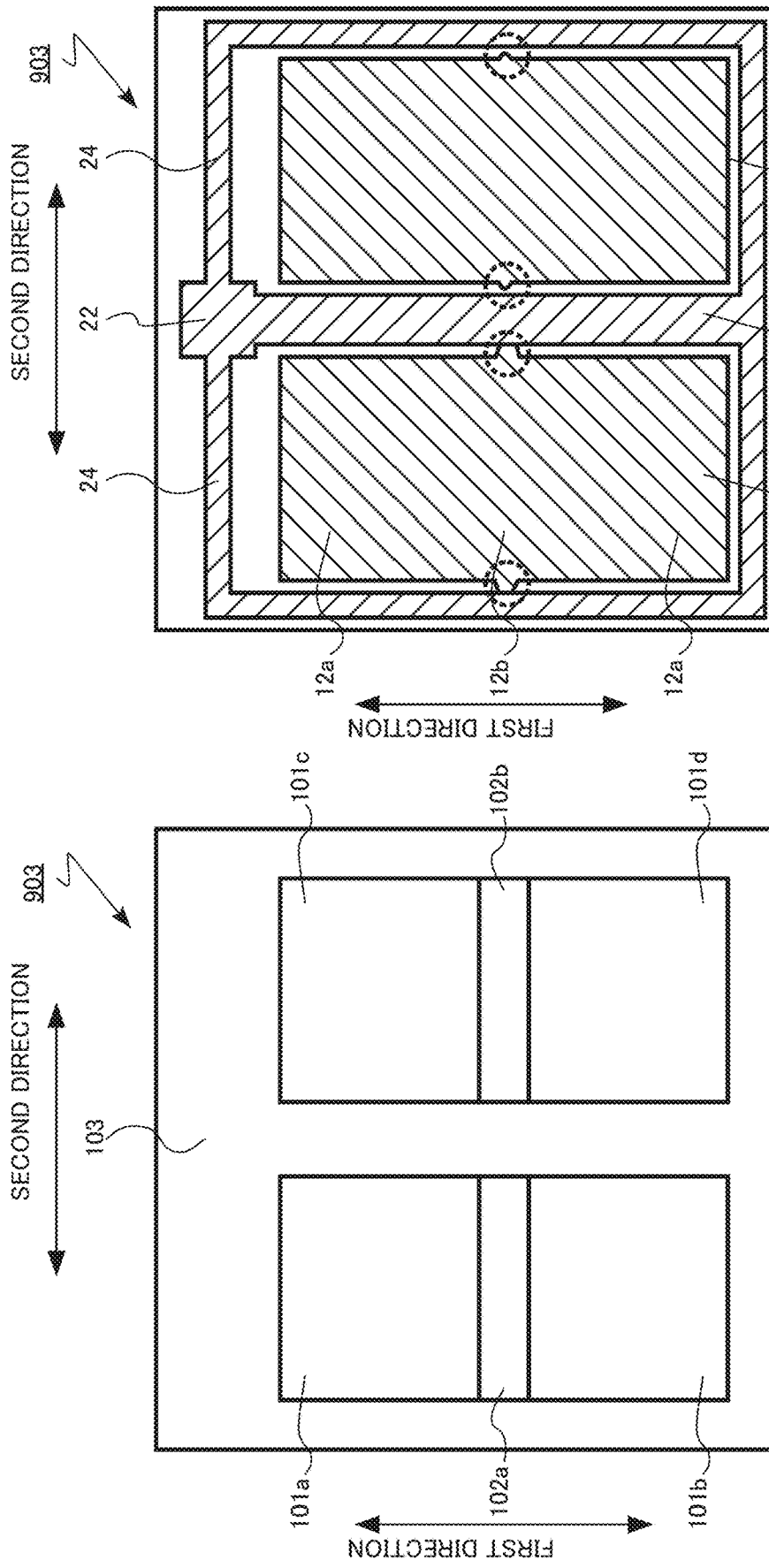
Figure 20:
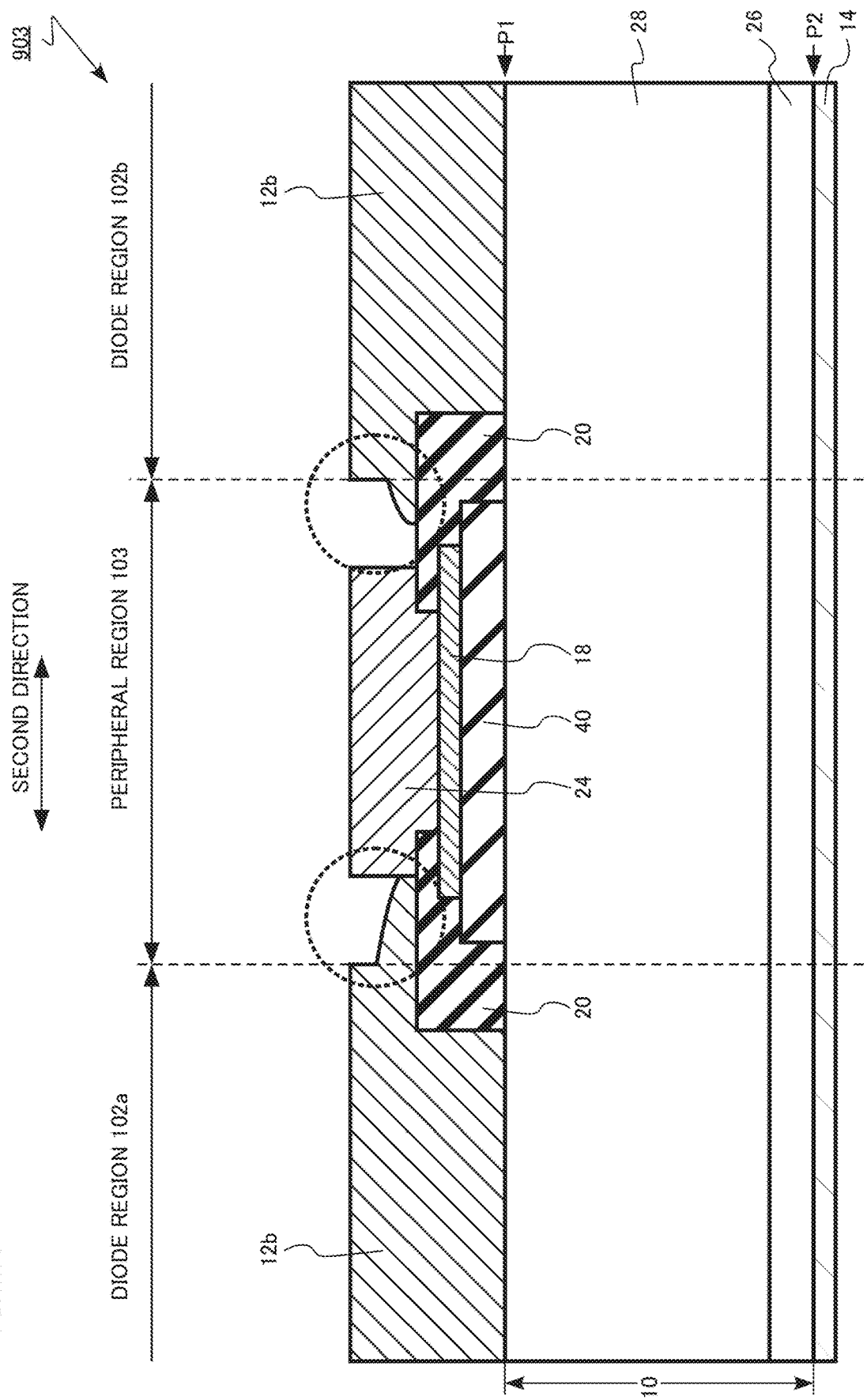
FIG. 20 is an explanatory diagram of the problem of the semiconductor device according to the third comparative example.

FIGS. 19A and 19B, and FIG. 20 are explanatory diagrams of problems of the semiconductor device of the third comparative example. FIGS. 19A and 19B are diagrams corresponding to FIGS. 1A and 1B of the first embodiment. FIG. 20 is a diagram corresponding to FIG. 17.

As described above, the MOSFET 903 of the third comparative example includes the diode region 102 provided between the transistor regions 101, thereby improving the surge current tolerance. Meanwhile, in the MOSFET 903 of the third comparative example, there is a problem in that variations in surge current tolerance among chips are large. In other words, there is a problem in that a chip having a low surge current tolerance may be accidentally generated.

As a result of failure analysis of a chip having a low surge current tolerance by the inventors, it has become clear that one of the causes of the low surge current tolerance is a short circuit between the source electrode 12 and the gate wiring 24. It has become clear that the short circuit between the source electrode 12 and the gate wiring 24 occurs when the source electrode 12 adjacent to the gate wiring 24 melts and flows in the lateral direction to come into contact with the gate wiring 24, as indicated by a dotted circle in FIGS. 19B and 20.

As illustrated in FIGS. 19B and 20, it has become clear that the short circuit between the source electrode 12 and the gate wiring 24 is particularly likely to occur between the second region 12b of the source electrode 12 of the diode region 102 and the gate wiring 24.

The reason why the short circuit is likely to occur between the second region 12b and the gate wiring 24 is considered to be that a surge current flowing through the diode region 102 is larger than that flowing through the transistor region 101, and thus a calorific value is larger. That is, it is considered that this is because the source electrode 12 easily melts as the calorific value increases.

In the MOSFET 100 of the first embodiment, as illustrated in FIGS. 6B, 7, and 8, the inorganic insulating layer 42 is provided between the source electrode 12 and the gate wiring 24. By providing the inorganic insulating layer 42 therebetween, even when the source electrode 12 melts, it is suppressed that the melted portion flows in the lateral direction and comes into contact with the gate wiring 24. Therefore, the short circuit between the source electrode 12 and the gate wiring 24 is suppressed.

For example, when a resin layer is provided between the source electrode 12 and the gate wiring 24, it is difficult to suppress the short circuit between the source electrode 12 and the gate wiring 24 because the resin layer has low heat resistance. Since the inorganic insulating layer 42 has higher heat resistance than that of the resin layer, the short circuit between the source electrode 12 and the gate wiring 24 can be suppressed.

First Modification

A semiconductor device according to a first modification of the first embodiment is different from the semiconductor device according to the first embodiment in that a peripheral region further includes a resin layer provided on an inorganic insulating layer.

Figure 21:
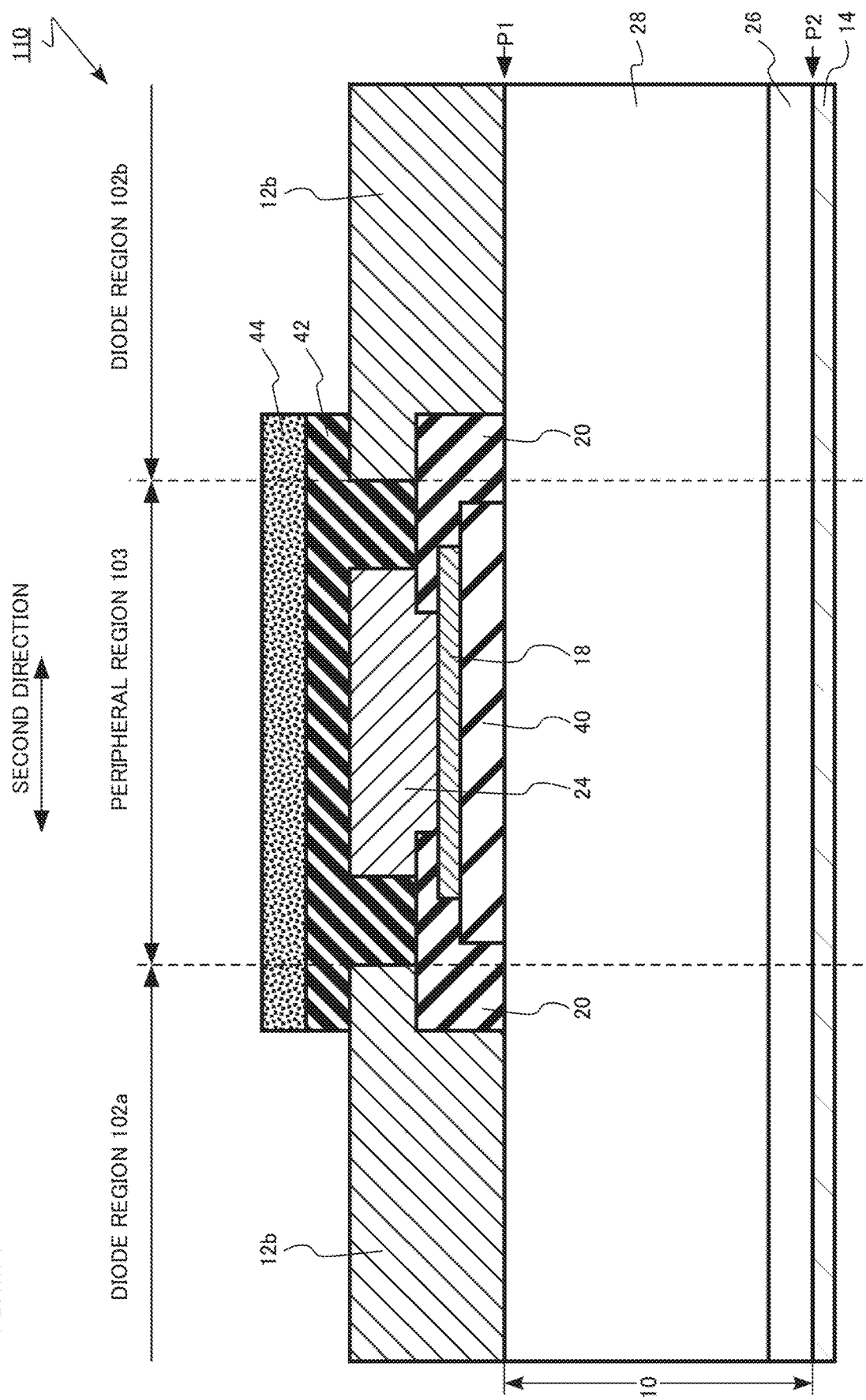
FIG. 21 is a schematic cross-sectional view of a first modification of the first embodiment.

FIG. 21 is a schematic cross-sectional view of the first modification of the first embodiment. FIG. 21 is a diagram corresponding to FIG. 7 of the first embodiment.

Figure 22:
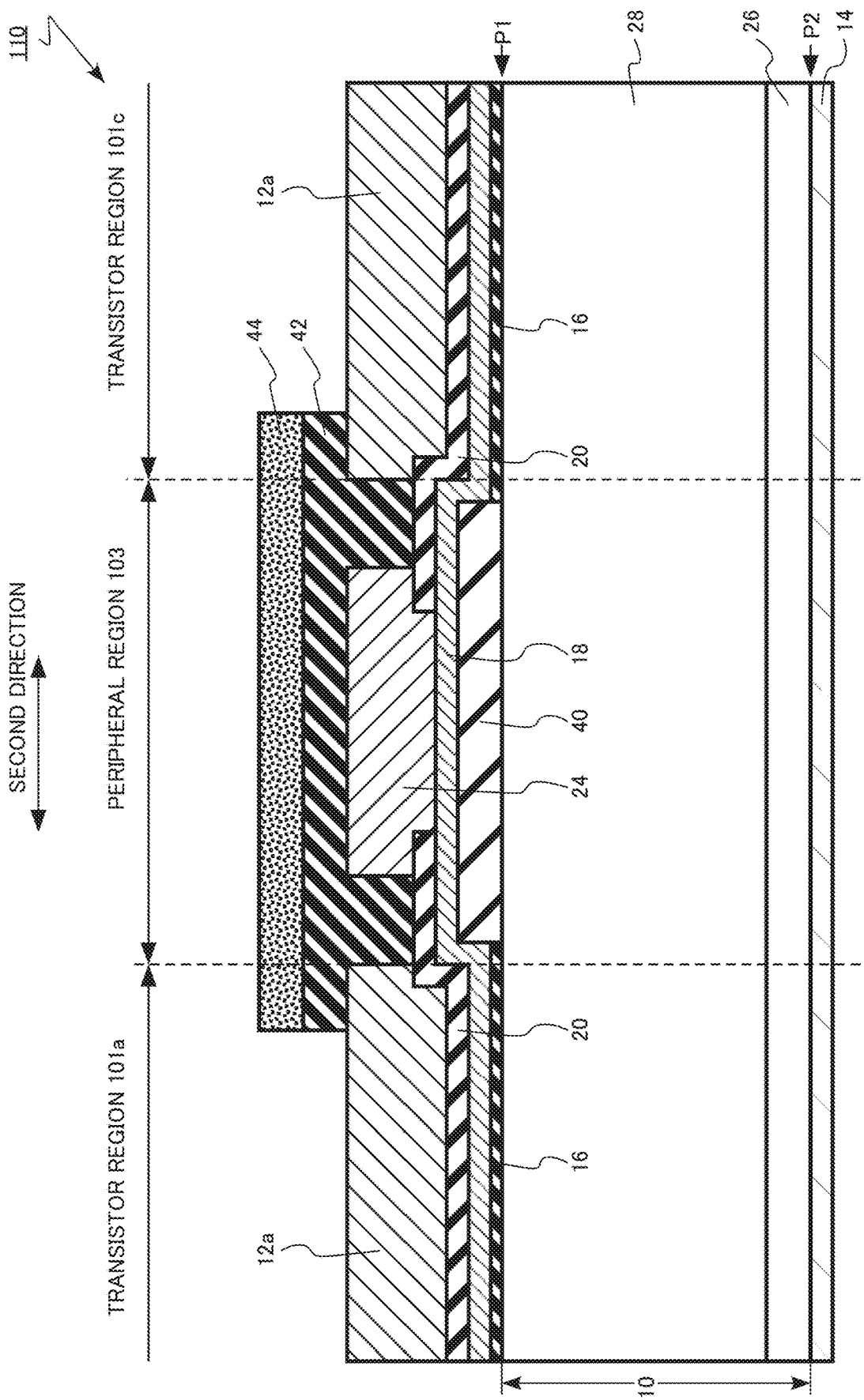
FIG. 22 is a schematic cross-sectional view of the first modification of the first embodiment.

FIG. 22 is a schematic cross-sectional view of the first modification of the first embodiment. FIG. 22 is a diagram corresponding to FIG. 8 of the first embodiment.

An MOSFET 110 of the first modification includes a resin layer 44 on the inorganic insulating layer 42. The resin layer 44 has, for example, a function of suppressing entry of moisture into the MOSFET 110. In addition, the resin layer 44 has, for example, a function of improving adhesion between the MOSFET 110 and the sealing resin. The resin layer 44 is, for example, polyimide.

Second Modification

A semiconductor device according to a second modification of the first embodiment is different from the semiconductor device according to the first embodiment in that a second distance between two second portions adjacent to each other with a fourth silicon carbide region interposed therebetween is larger than a first distance between two first portions adjacent to each other with a second silicon carbide region interposed therebetween.

An MOSFET of the second modification has the same structure as that of the MOSFET 100 of the first embodiment except that the second distance d2 between the two second portions 28b adjacent to each other with the p region 32 interposed therebetween is larger than the first distance d1 between the two first portions 28a adjacent to each other with the body region 30 interposed therebetween. The second distance d2 is, for example, 1.1 times or more and 2 times or less the first distance d1.

As the distance d2 increases, the forward voltage (Vf) of the pn junction diode in the diode region 102 decreases. Therefore, when a large surge voltage is applied to the MOSFET of the second modification, the current flowing through the pn junction diode of the diode region 102 becomes larger than that of the MOSFET 100 of the first embodiment. Therefore, the surge current tolerance of the MOSFET is further improved.

From the viewpoint of suppressing the forward voltage (Vf) of the pn junction diode in the diode region 102 from becoming too low, the second distance d2 is preferably twice or less the first distance d1.

As described above, according to the first embodiment and the modification, the MOSFET in which the surge current tolerance is improved is realized.

Second Embodiment

A semiconductor device according to a second embodiment is different from the semiconductor device according to the first embodiment in that the inorganic insulating layer is not provided between the first region of the first electrode and the gate wiring. Hereinafter, some descriptions of contents overlapping with the first embodiment may be omitted.

Figure 23B:
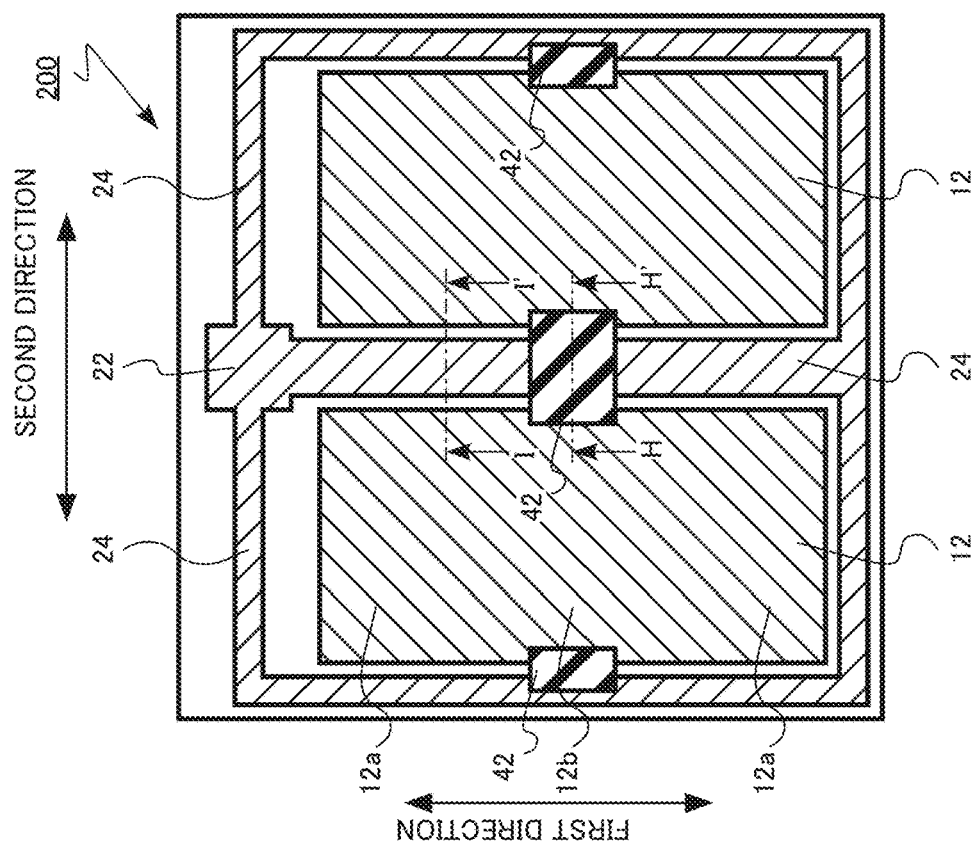
FIGS. 23A and 23B are schematic top views of a semiconductor device according to a second embodiment.
Figure 23A:
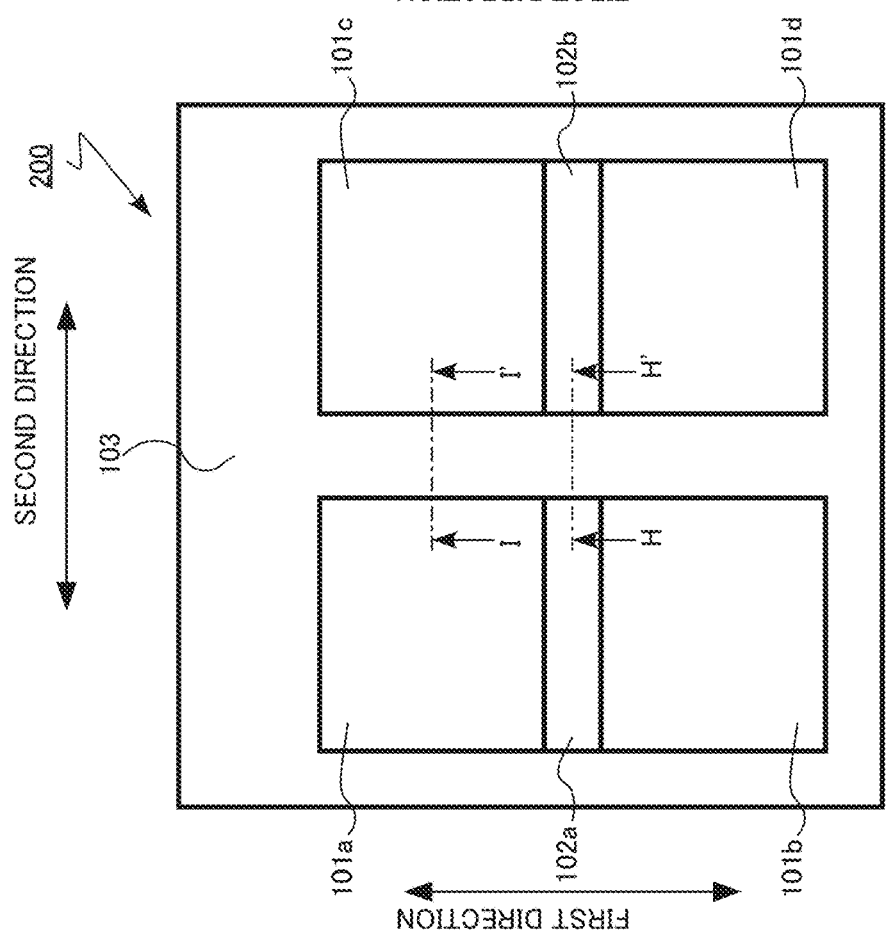

FIGS. 23A and 23B are schematic top views of the semiconductor device according to the second embodiment. FIG. 23A is an arrangement diagram of each region provided in an MOSFET 200. FIG. 23B is a diagram illustrating a pattern of an electrode and an inorganic insulating layer on the upper face of the MOSFET 200.

Figure 24:
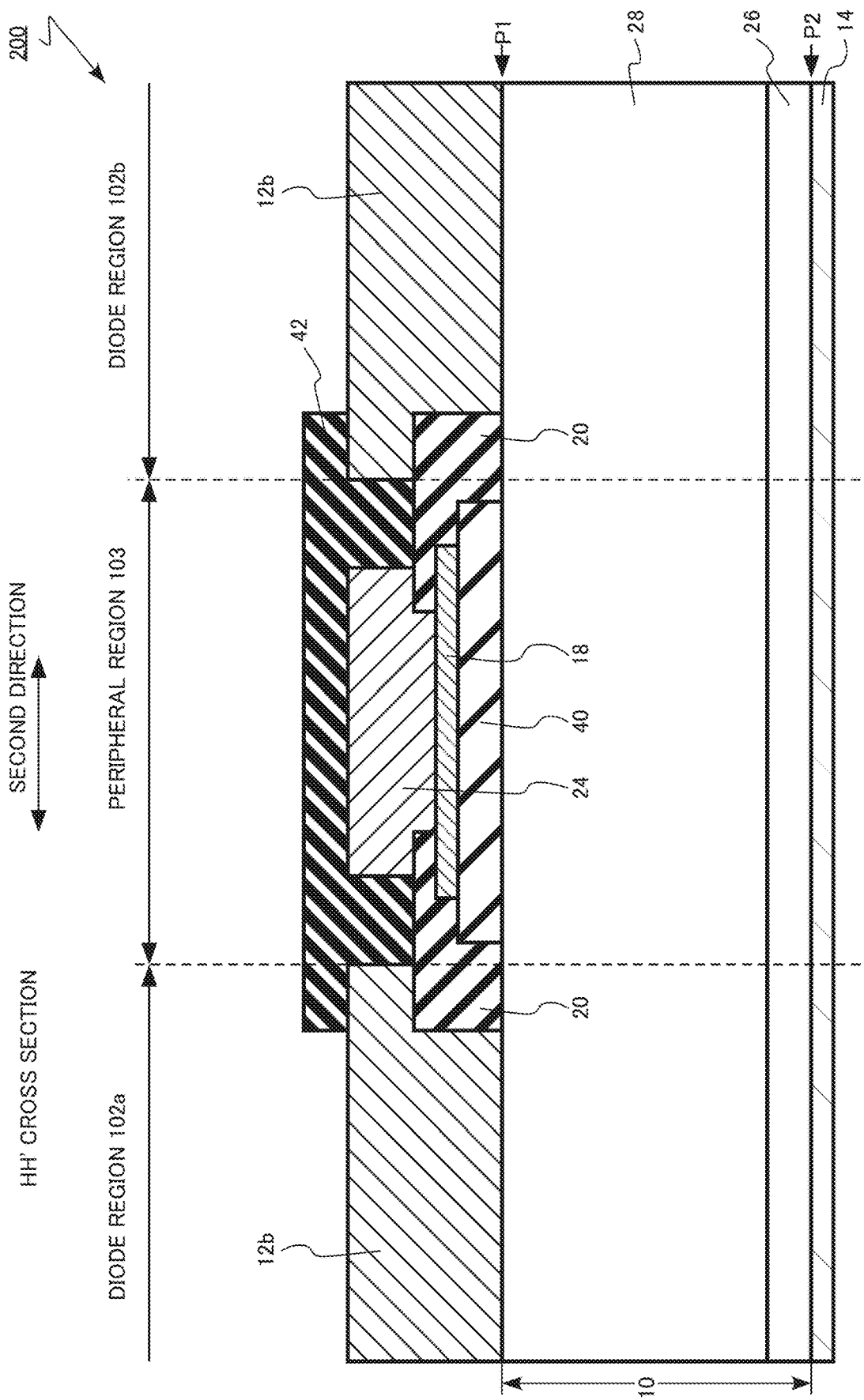
FIG. 24 is a schematic cross-sectional view of the semiconductor device according to the second embodiment.

FIG. 24 is a schematic cross-sectional view of the semiconductor device according to the second embodiment. FIG. 24 is a cross-sectional view taken along line H-H' in FIGS. 23A and 23B.

Figure 25:
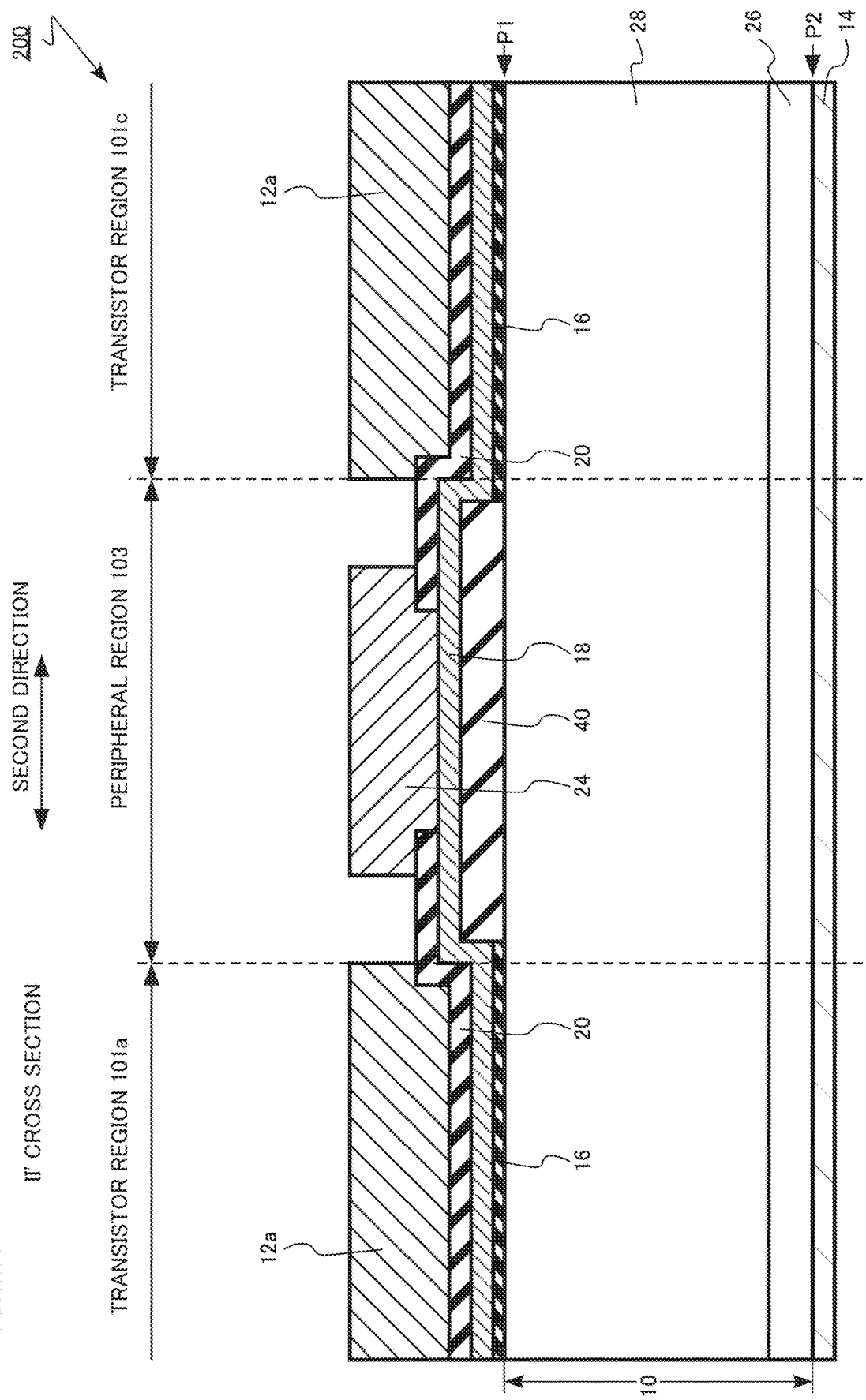
FIG. 25 is a schematic cross-sectional view of the semiconductor device according to the second embodiment.

FIG. 25 is a schematic cross-sectional view of the semiconductor device according to the second embodiment. FIG. 25 is a cross-sectional view taken along line I-I' in FIGS. 23A and 23B.

As illustrated in FIGS. 23B and 24, the MOSFET 200 of the second embodiment is provided between the second region 12b of the source electrode 12 and the gate wiring 24 in the second direction. Meanwhile, as illustrated in FIGS. 24 and 25, the inorganic insulating layer 42 is not provided between the first region 12a of the source electrode 12 and the gate wiring 24 in the second direction. The inorganic insulating layer 42 is provided only partially between the source electrode 12 and the gate wiring 24.

In the MOSFET 200 of the second embodiment, particularly, the inorganic insulating layer 42 is provided only between the second region 12b of the source electrode 12 of the diode region 102 where short-circuiting is likely to occur and the gate wiring 24. The inorganic insulating layer 42 is not provided in other regions, thereby making it possible to suppress, for example, disconnection of the gate wiring 24 due to stress migration.

Modification

A semiconductor device according to a modification of the second embodiment is different from the semiconductor device according to the second embodiment in that the peripheral region further includes a resin layer provided on the inorganic insulating layer, and the resin layer is provided between the first region and the gate wiring in a direction parallel to the first plane.

Figure 26:
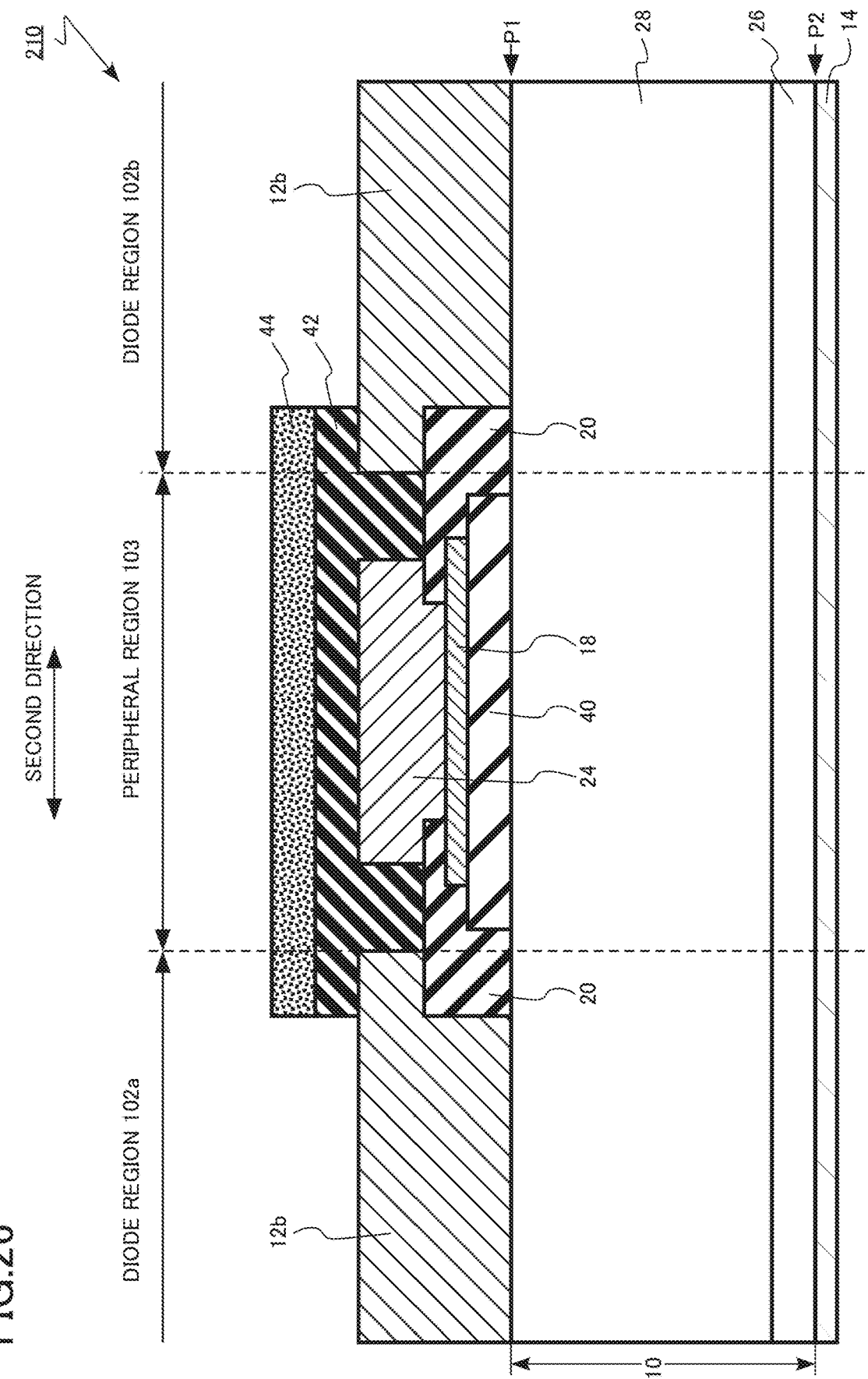
FIG. 26 is a schematic cross-sectional view of a modification of the second embodiment.

FIG. 26 is a schematic cross-sectional view of the modification of the second embodiment. FIG. 26 is a diagram corresponding to FIG. 24 of the second embodiment.

Figure 27:
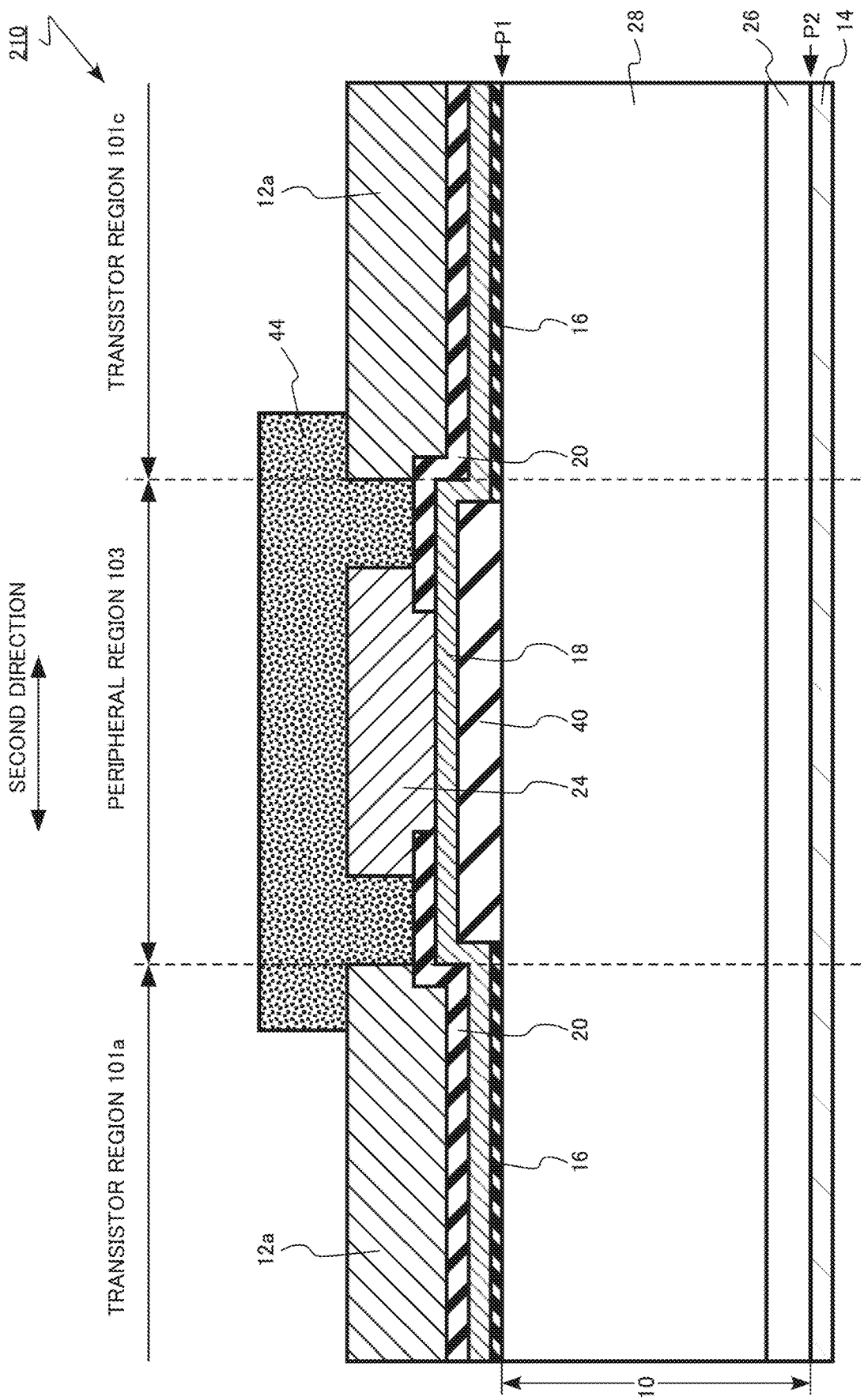
FIG. 27 is a schematic cross-sectional view of the modification of the second embodiment.

FIG. 27 is a schematic cross-sectional view of the modification of the second embodiment. FIG. 27 is a diagram corresponding to FIG. 25 of the first embodiment.

An MOSFET 210 of the modification includes a resin layer 44 on the inorganic insulating layer 42. In addition, the resin layer 44 is provided between the first region 12a of the source electrode 12 and the gate wiring 24 in the second direction.

The resin layer 44 is in contact with, for example, the side face and the upper face of the first region 12a. In addition, the resin layer 44 is in contact with, for example, the side face and the upper face of the gate wiring 24. The resin layer 44 is provided, for example, between the side face of the first region 12a and the side face of the gate wiring 24.

The resin layer 44 has, for example, a function of suppressing entry of moisture into the MOSFET 210. In addition, the resin layer 44 has, for example, a function of improving adhesion between the MOSFET 210 and the sealing resin.

The resin layer 44 is, for example, polyimide.

As described above, according to the second embodiment and the modification, it is possible to implement the MOSFET configured to improve the surge current tolerance.

Third Embodiment

A semiconductor device of a third embodiment is different from the semiconductor device of the first embodiment in that a first transistor region is provided between a second diode region, which is one of at least one diode region, and a first diode region. Hereinafter, some descriptions of contents overlapping with the first embodiment may be omitted.

Figure 28B:
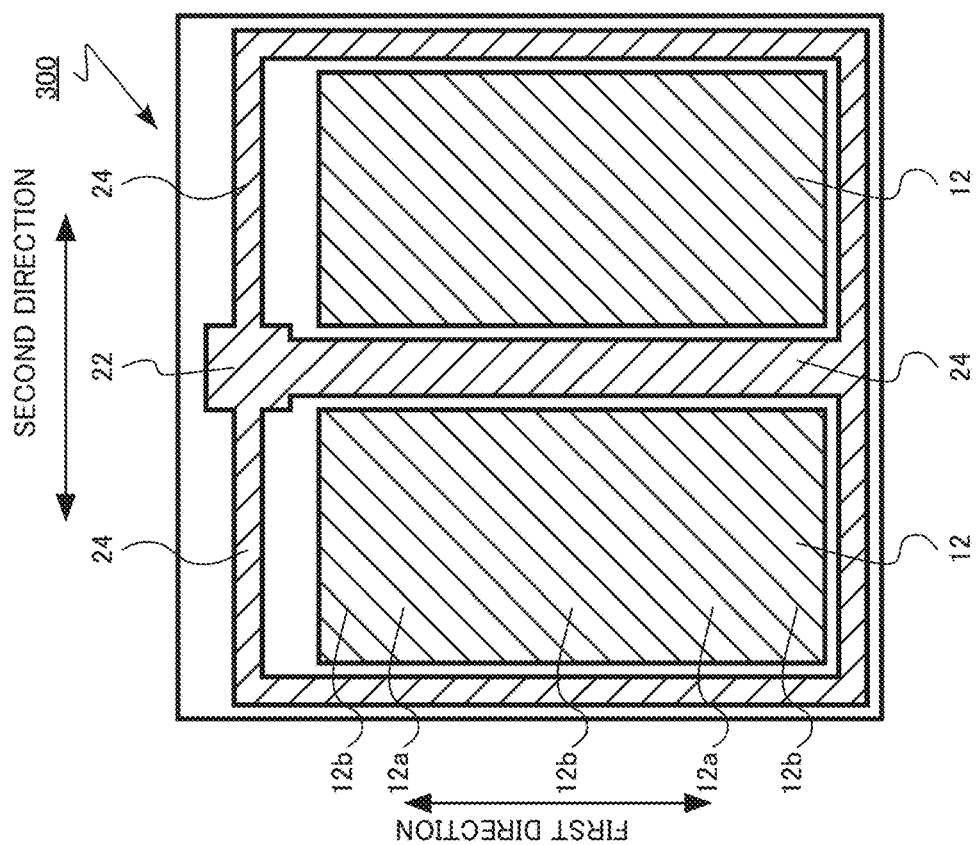
FIGS. 28A and 28B are schematic top views of a semiconductor device according to a third embodiment.
Figure 28A:
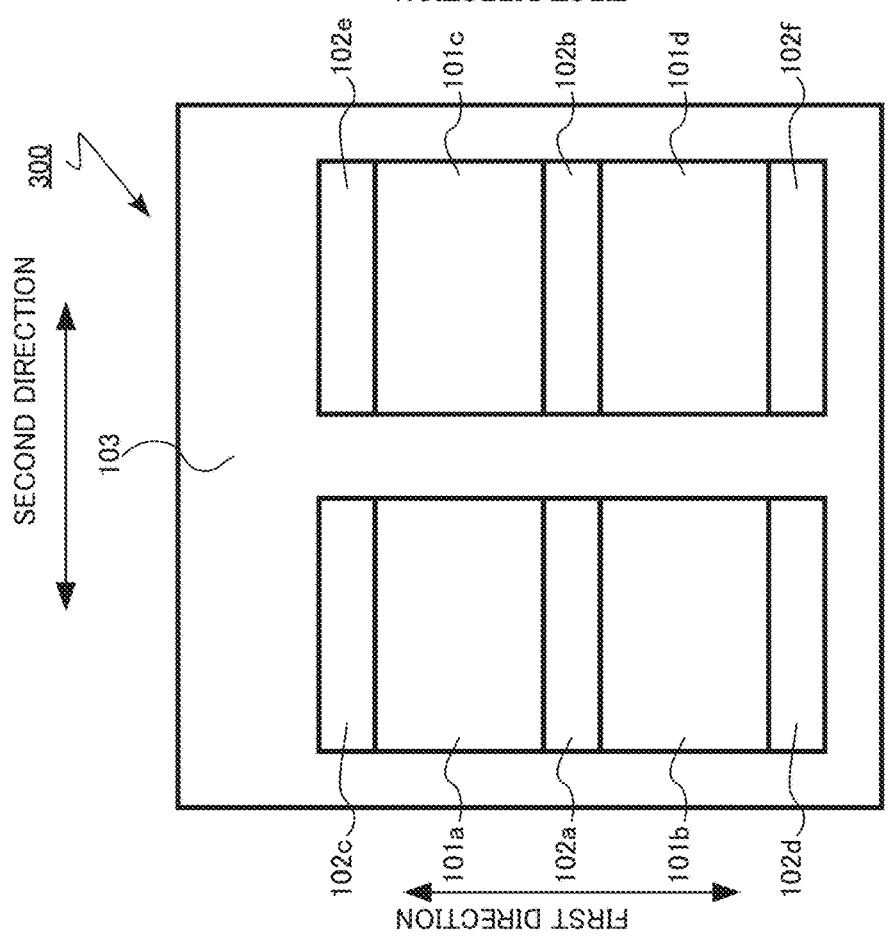

FIGS. 28A and 28B are schematic top views of the semiconductor device according to the third embodiment. FIG. 28A is an arrangement diagram of each region provided in an MOSFET 300 of the third embodiment. FIG. 28B is a diagram illustrating a pattern of an electrode and a wiring on the upper face of the MOSFET of the third embodiment. FIGS. 28A and 28B are diagrams corresponding to FIGS. 1A and 1B of the first embodiment.

As shown in FIG. 28A, the MOSFET 300 of the third embodiment includes a transistor region 101a (first transistor region), a transistor region 101b (second transistor region), a transistor region 101c, a transistor region 101d, a diode region 102a (first diode region), a diode region 102b, a diode region 102c (second diode region), a diode region 102d, a diode region 102e, a diode region 102f, and a peripheral region 103. The transistor region 101a is an example of a first transistor region. The transistor region 101b is an example of a second transistor region. The diode region 102a is an example of a first diode region. The diode region 102c is an example of a second diode region.

Hereinafter, the transistor region 101a, the transistor region 101b, the transistor region 101c, and the transistor region 101d may be simply referred to as a transistor region 101 individually or collectively. In addition, the diode region 102a and the diode region 102b may be simply referred to as a diode region 102 individually or collectively.

The MOSFET and the SBD are provided in the transistor region 101. The SBD is provided in the diode region 102. The MOSFET is not provided in the diode region 102.

The diode region 102 is provided between the two transistor regions 101. For example, the diode region 102a is provided between the transistor region 101a and the transistor region 101b. The transistor region 101b is provided in the first direction parallel to a first plane P1 with respect to the transistor region 101a.

The transistor region 101 is provided between the two diode regions 102. For example, the transistor region 101a is provided between the diode region 102a and the diode region 102c. Furthermore, for example, the transistor region 101b is provided between the diode region 102a and the diode region 102d.

When a surge current flows through the MOSFET 300 of the third embodiment, a calorific value of the diode region 102 is larger than a calorific value of the transistor region 101. In the MOSFET 300 of the third embodiment, since the diode region 102 is dispersedly disposed, a high-temperature region is dispersed in the chip of the MOSFET 300. Therefore, breakdown due to heat generation of the MOSFET 300 is suppressed.

In addition, in the MOSFET 300 of the third embodiment, the diode regions 102 are respectively provided on the opposite sides of the transistor region 101. Therefore, propagation of carriers and propagation of heat from the diode region 102 to the transistor region 101 are promoted. There-fore, a current flowing through the pn junction diode of the transistor region 101 adjacent to the diode region 102 increases, and a surge current tolerance is further improved.

As described above, according to the third embodiment, it is possible to implement the MOSFET configured to further improve the surge current tolerance.

Fourth Embodiment

A semiconductor device according to a fourth embodiment is different from the semiconductor device according to the first embodiment in that a third diode region, which is one of at least one diode region, is provided between a first transistor region and a third transistor region, which is one of a plurality of transistor regions provided in the second direction parallel to a first plane and perpendicular to the first direction with respect to the first transistor region. Hereinafter, some descriptions of contents overlapping with the first embodiment may be omitted.

Figure 29A:
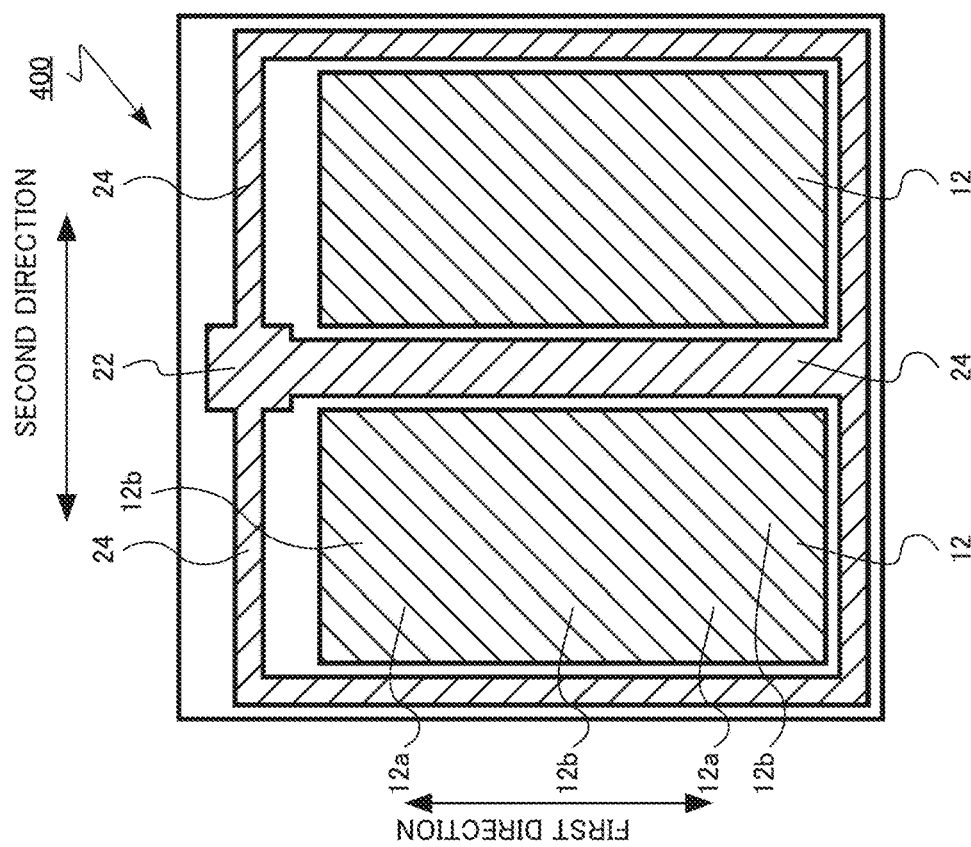
FIGS. 29A and 29B are schematic top views of a semiconductor device according to a fourth embodiment.
Figure 29B:
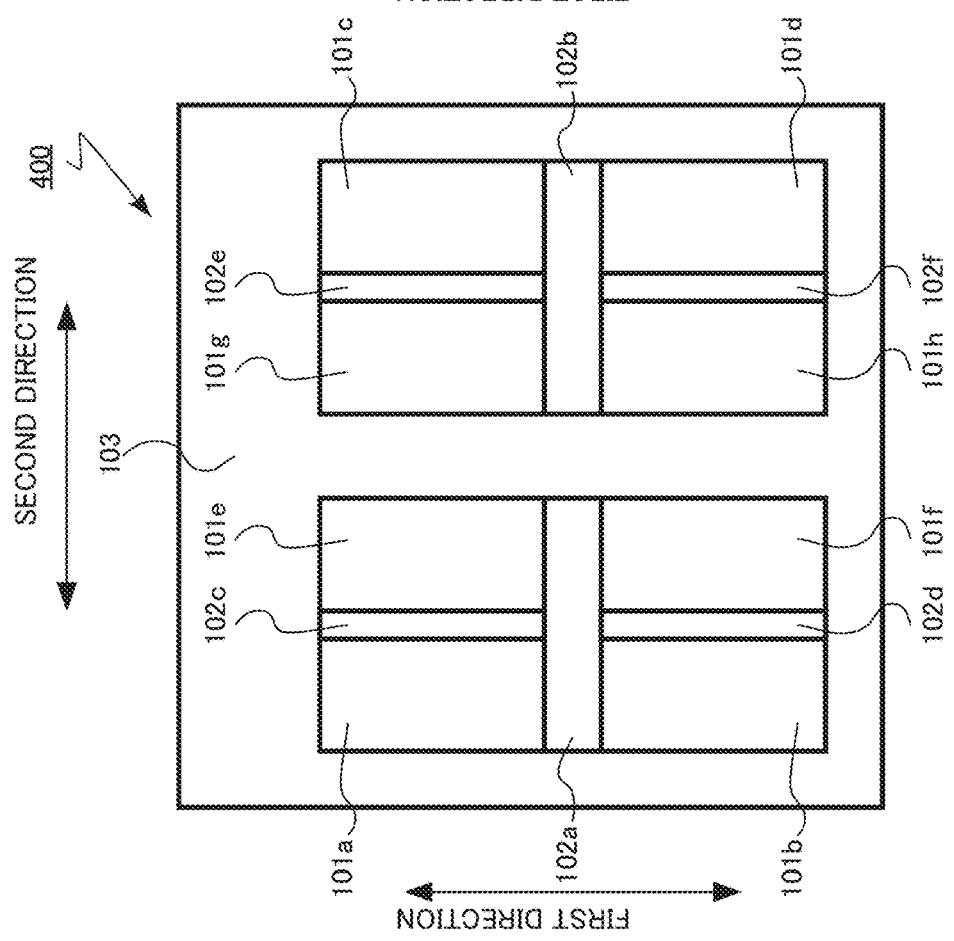

FIGS. 29A and 29B are schematic top views of the semiconductor device according to the fourth embodiment. FIG. 29A is an arrangement diagram of each region provided in an MOSFET 400 of the fourth embodiment. FIG. 29B is a diagram illustrating a pattern of an electrode and a wiring on the upper face of the MOSFET 400 of the fourth embodiment. FIGS. 29A and 29B are diagrams corresponding to FIGS. 1A and 1B of the first embodiment.

As shown in FIG. 29A, the MOSFET 400 of the fourth embodiment includes a transistor region 101a (first transistor region), a transistor region 101b (second transistor region), a transistor region 101c, a transistor region 101d, a transistor region 101e (third transistor region), a transistor region 101f, a transistor region 101g, a transistor region 101h, a diode region 102a (first diode region), a diode region 102b, a diode region 102c (third diode region), a diode region 102d, a diode region 102e, a diode region 102f, and a peripheral region 103. The transistor region 101a is an example of a first transistor region. The transistor region 101e is an example of a third transistor region. The diode region 102a is an example of a first diode region. The diode region 102c is an example of a third diode region.

Hereinafter, the transistor region 101a, the transistor region 101b, the transistor region 101c, and the transistor region 101d may be simply referred to as a transistor region 101 individually or collectively. In addition, the diode region 102a and the diode region 102b may be simply referred to as a diode region 102 individually or collectively.

The MOSFET and the SBD are provided in the transistor region 101. The SBD is provided in the diode region 102. The MOSFET is not provided in the diode region 102.

The diode region 102 is provided between the two transistor regions 101. For example, the diode region 102a is provided between the transistor region 101a and the transistor region 101b. The transistor region 101b is provided in the first direction parallel to a first plane P1 with respect to the transistor region 101a. The diode region 102a extends in the second direction.

Furthermore, for example, the diode region 102c is provided between the transistor region 101a and the transistor region 101e. The transistor region 101e is provided in the second direction parallel to the first plane P1 and perpendicular to the first direction with respect to the transistor region 101a. The diode region 102c extends in the first direction. The diode region 102c is in contact with the diode region 102a.

When a surge current flows through the MOSFET 400 of the fourth embodiment, a calorific value of the diode region 102 is larger than a calorific value of the transistor region 101. In the MOSFET 400 of the fourth embodiment, since the diode region 102 is dispersedly disposed, a high-temperature region of the MOSFET 400 is dispersed. Therefore, breakdown due to heat generation of the MOSFET 400 is suppressed.

Furthermore, in the MOSFET 400 of the fourth embodiment, the diode region 102 is provided adjacent to the transistor region 101 in the first direction and the second direction. Therefore, propagation of carriers and propagation of heat from the diode region 102 to the transistor region 101 are promoted. Therefore, a current flowing through the pn junction diode of the transistor region 101 adjacent to the diode region 102 increases, and a surge current tolerance is further improved.

In addition, in the MOSFET 400 of the fourth embodiment, the diode region 102 extending in the first direction and the diode region 102 extending in the second direction are in contact with each other. Therefore, propagation of carriers and propagation of heat from the diode region 102 to the transistor region 101 are further promoted. Therefore, a current flowing through the pn junction diode of the transistor region 101 adjacent to the diode region 102 increases, and a surge current tolerance is further improved.

Fifth Embodiment

An inverter circuit and a driving device according to a fifth embodiment are an inverter circuit and a driving device including the semiconductor device according to the first embodiment.

Figure 30:
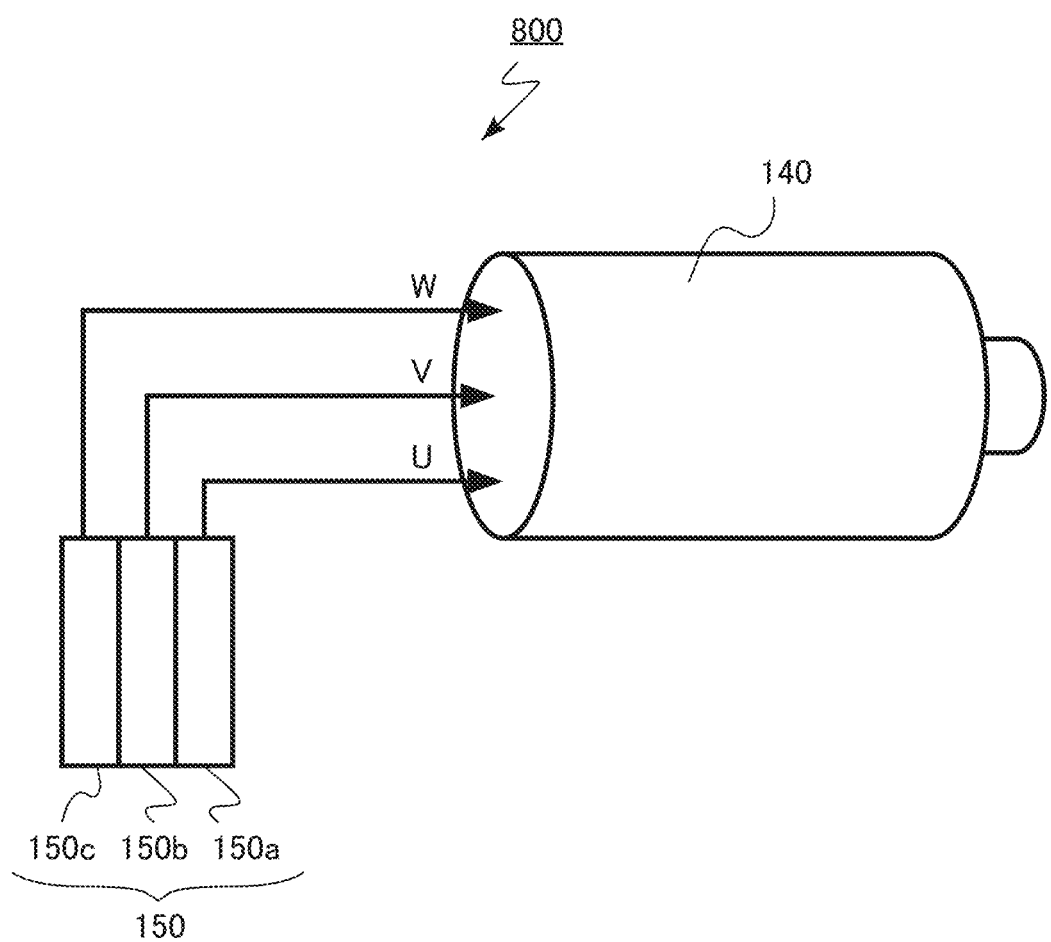
FIG. 30 is a schematic diagram of a driving device according to a fifth embodiment.

FIG. 30 is a schematic diagram of the driving device according to the fifth embodiment. A driving device 800 includes a motor 140 and an inverter circuit 150.

The inverter circuit 150 includes three semiconductor modules 150a, 150b, and 150c using the MOSFET 100 of the first embodiment as a switching element. By connecting the three semiconductor modules 150a, 150b, and 150c in parallel, a three-phase inverter circuit 150 including three AC voltage output terminals U, V, and W is implemented. The motor 140 is driven by the AC voltage output from the inverter circuit 150.

According to the fifth embodiment, the characteristics of the inverter circuit 150 and the driving device 800 are improved by including the MOSFET 100 with improved characteristics.

Sixth Embodiment

A vehicle according to a sixth embodiment is a vehicle including the semiconductor device according to the first embodiment.

Figure 31:
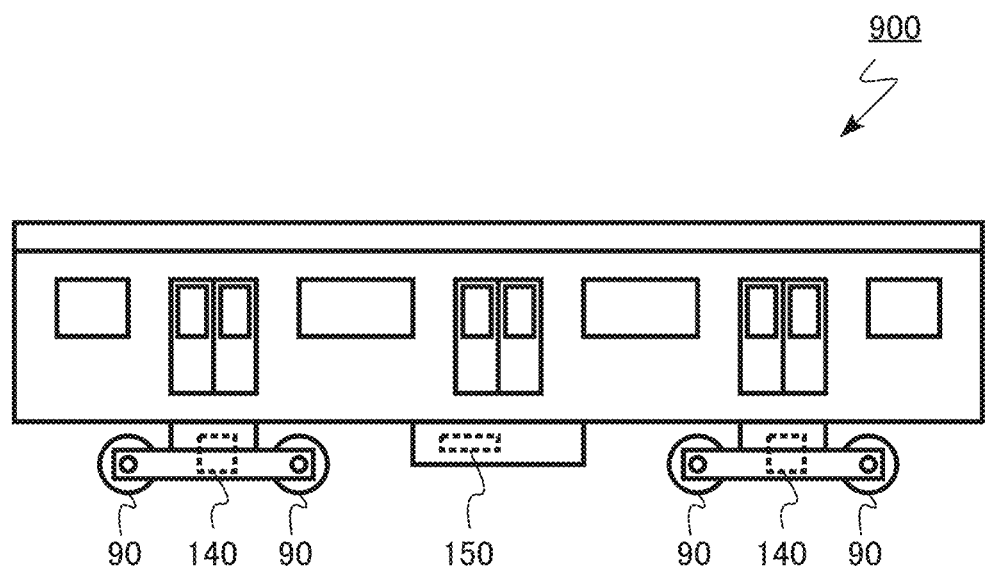
FIG. 31 is a schematic diagram of a vehicle according to a sixth embodiment.

FIG. 31 is a schematic diagram of the vehicle according to the sixth embodiment. A vehicle 900 according to the sixth embodiment is a railway vehicle. The vehicle 900 includes a motor 140 and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented. The motor 140 is driven by the AC voltage output from the inverter circuit 150. Wheels 90 of the vehicle 900 are rotated by the motor 140.

According to the sixth embodiment, characteristics of the vehicle 900 are improved by providing the MOSFET 100 with improved characteristics.

Seventh Embodiment

A vehicle according to a seventh embodiment is a vehicle including the semiconductor device according to the first embodiment.

Figure 32:
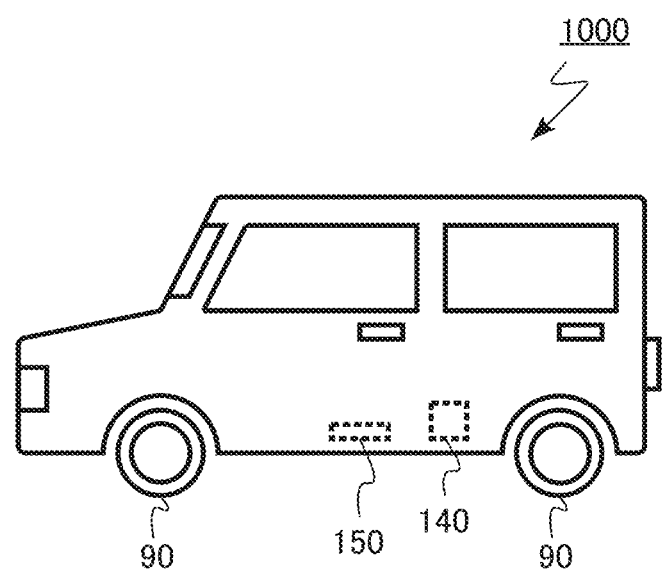
FIG. 32 is a schematic diagram of a vehicle according to a seventh embodiment.

FIG. 32 is a schematic diagram of the vehicle according to the seventh embodiment. A vehicle 1000 according to the seventh embodiment is an automobile. The vehicle 1000 includes a motor 140 and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. Wheels 90 of the vehicle 1000 are rotated by the motor 140.

According to the seventh embodiment, characteristics of the vehicle 1000 are improved by providing the MOSFET 100 with improved characteristics.

Eighth Embodiment

An elevator according to an eighth embodiment is an elevator including the semiconductor device according to the first embodiment.

Figure 33:
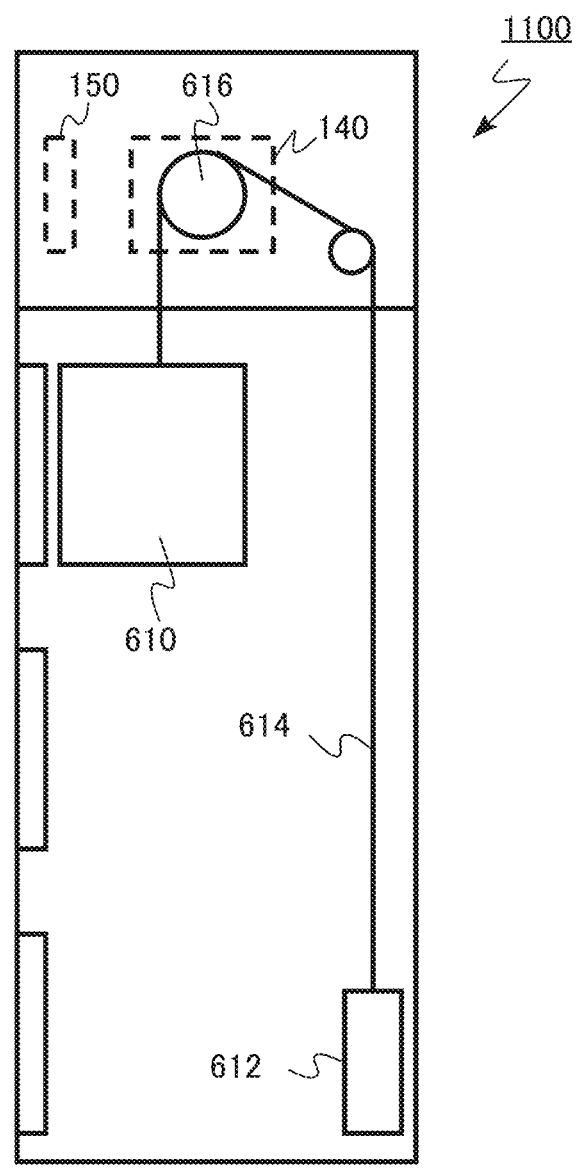
FIG. 33 is a schematic diagram of an elevator according to an eighth embodiment.

FIG. 33 is a schematic diagram of the elevator (lift) according to the eighth embodiment. An elevator 1100 of the eighth embodiment includes a car 610, a counterweight 612, a wire rope 614, a hoisting machine 616, a motor 140, and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. The hoisting machine 616 is rotated by the motor 140, and the car 610 moves upwards and downwards.

According to the eighth embodiment, the characteristics of the elevator 1100 are improved by providing the MOSFET 100 with improved characteristics.

In the first to fourth embodiments, the case of 4H-SiC has been described as an example of the crystal structure of SiC, but the present disclosure can also be applied to devices using SiC having other crystal structures such as 6H—SiC and 3C—SiC. Further, it is also possible to apply a face other than the (0001) face to the surface of the silicon carbide layer 10.

In the first to fourth embodiments, the case where the gate electrode 18 has a so-called stripe shape has been described as an example, but the shape of the gate electrode 18 is not limited to the stripe shape. For example, the shape of the gate electrode 18 may be a lattice shape.

In the first to fourth embodiments, aluminum (Al) is exemplified as the p-type impurity, but boron (B) can also be used. In addition, although nitrogen (N) and phosphorus (P) have been exemplified as the n-type impurity, arsenic (As), antimony (Sb), and the like can also be applied.

Furthermore, in the fifth to eighth embodiments, the configuration including the MOSFET 100 of the first embodiment has been described as an example, but a configuration including the MOSFETs of the second to fourth embodiments is also possible.

In the fifth to eighth embodiments, the case where the semiconductor device of the present disclosure is applied to a vehicle or an elevator has been described as an example, but the semiconductor device of the present disclosure can also be applied to, for example, a power conditioner of a solar power generation system.

While certain embodiments have been described, these embodiments have been presented by way of example only, and are not intended to limit the scope of the inventions. Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a plurality of transistor regions;
   at least one diode region; and
   a peripheral region surrounding the transistor regions and the at least one diode region,
   wherein the transistor regions include:
   a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane;
   a first electrode in contact with the first portions, the second silicon carbide region, and the third silicon carbide region;
   a second electrode in contact with the second plane;
   a gate electrode facing the second silicon carbide region; and
   a gate insulating layer provided between the gate electrode and the second silicon carbide region,
   wherein the at least one diode region includes:
   the second electrode;
   the silicon carbide layer including the first silicon carbide region of n-type having a plurality of second portions in contact with the first plane and a fourth silicon carbide region of p-type provided between the first silicon carbide region and the first plane; and
   the first electrode in contact with the second portions and the fourth silicon carbide region;
   wherein the peripheral region includes:
   the silicon carbide layer;
   a gate electrode pad provided on a side of the first plane with respect to the silicon carbide layer;
   a gate wiring configured to electrically connect the gate electrode pad to the gate electrode and formed to extend in a first direction parallel to the first plane; and
   an inorganic insulating layer provided between the first electrode and the gate wiring in a second direction parallel to the first plane and perpendicular to the first direction,
   wherein an occupied area per unit area of the fourth silicon carbide region projected onto the first plane is larger than an occupied area per the unit area of the second silicon carbide region projected onto the first plane, and
   wherein a first diode region being one of the at least one diode region is provided between a first transistor region and a second transistor region, the first transistor region is one of the transistor regions, and the second transistor region is one of the transistor regions provided in the first direction with respect to the first transistor region.

2. The semiconductor device according to claim 1, wherein the first electrode includes a first region in the transistor regions and a second region in the at least one diode region, and
   wherein the inorganic insulating layer is provided between the second region and the gate wiring.

3. The semiconductor device according to claim 1, wherein the inorganic insulating layer is in contact with an upper face and a side face of the first electrode, and the inorganic insulating layer is in contact with an upper face and a side face of the gate wiring.

4. The semiconductor device according to claim 1, wherein the peripheral region further includes a resin layer provided on the inorganic insulating layer.

5. The semiconductor device according to claim 4, wherein the first electrode includes a first region in the transistor regions and a second region in the at least one diode region,
   wherein the inorganic insulating layer is provided between the second region and the gate wiring in the second direction, and
   wherein the resin layer is provided between the first region and the gate wiring in the second direction.

6. The semiconductor device according to claim 1, wherein the inorganic insulating layer contains at least one of an oxide and a nitride.

7. The semiconductor device according to claim 1, wherein the inorganic insulating layer contains at least one of silicon oxide and silicon nitride.

8. The semiconductor device according to claim 4, wherein the resin layer contains polyimide.

9. The semiconductor device according to claim 1, wherein the first electrode, the gate electrode pad, and the gate wiring are formed of a same metal material.

10. The semiconductor device according to claim 1, wherein a contact area per the unit area between the first electrode and the fourth silicon carbide region is larger than a contact area per the unit area between the first electrode and the second silicon carbide region.

11. The semiconductor device according to claim 1, wherein a second distance between two of the second portions adjacent to each other with the fourth silicon carbide region interposed therebetween is equal to a first distance between two of the first portions adjacent to each other with the second silicon carbide region interposed therebetween.

12. The semiconductor device according to claim 1, wherein a second distance between two of the second portions adjacent to each other with the fourth silicon carbide region interposed therebetween is larger than a first distance between two of the first portions adjacent to each other with the second silicon carbide region interposed therebetween.

13. The semiconductor device according to claim 12, wherein the second distance is equal to or less than twice the first distance.

14. The semiconductor device according to claim 1, wherein a width of the first diode region in the first direction is 30 μm or more.

15. An inverter circuit comprising the semiconductor device according to claim 1.

16. A driving device comprising the semiconductor device according to claim 1.

17. A vehicle comprising the semiconductor device according to claim 1.

18. An elevator comprising the semiconductor device according to claim 1.

* * * * *